United States Patent [19]

Phillips et al.

[11] 4,370,707
[45] Jan. 25, 1983

[54] COMPUTER SYSTEM FOR GENERATING ARCHITECTURAL SPECIFICATIONS AND PROJECT CONTROL INSTRUCTIONS

[75] Inventors: Clarence W. Phillips, Canton; Michael R. Eiben, Chicago; Harvey T. Morgan, Jr., Oak Park, all of Ill.

[73] Assignee: Computer Service, Inc., Chicago, Ill.

[21] Appl. No.: 168,711

[22] Filed: Aug. 3, 1971

[51] Int. Cl.³ .......................................... G06F 15/21
[52] U.S. Cl. .................................... 364/200; 364/300
[58] Field of Search ........................................ 364/300

[56] References Cited

PUBLICATIONS

Fair, G. R., et al., "Note on the Computer as an Aid to the Architect", The Computer Journal, vol. 9, Issue 1, May, 1966, pp. 16–20.

*Primary Examiner*—Raulfe B. Zache
*Attorney, Agent, or Firm*—Emrich, Lee, Brown & Hill

[57] ABSTRACT

A computer system is disclosed for preparing a complete set of architectural specifications for constructing a building, including, if desired, sets of instructions that will be used by personnel during preparation of construction drawings and during construction. A specifier uses brief symbolic characters representative of individual phrases from a large information repository called a Master Phrase Catalog, to mark decisions and phrase selections in code on an order form designed to facilitate the specifier's task. The information in the Master Phrase Catalog includes construction materials, techniques, reference information, testing and industry standards which are correlated with instructional information and work assignments for various groups of people. The specifier uses only a limited number of commands to completely specify a project. The code is fed into a computer which has all the information in the Master Phrase Catalog stored on permanent record file, called the specification data file, with an index file correlating the specifier's code with the phrases that will eventually make up the specification. The computer is programmed to edit the input code for errors, prepare a listing of the input specifier's code and prepare an architectural specification from the specification data file together with a table of contents and listing of errors, if any. If called for by the specifier, sets of instructions, correlated to the particular phrases selected from the Master Phrase Catalog and stored in permanent memory will be printed out as separate booklets.

17 Claims, 23 Drawing Figures

```
GENERAL NOTES, STANDARDS, SHOP DRAWINGS
------------------------------------------------------------------------

1            AND
2            OR
3            SAME AS PRECEDING, EXCEPT
4       *
5         *
6           *
7             *

8               DIVISION I - STRUCTURAL GLUED LAMINATED TIMBER
    ------------------------------------------------------------------

9               DIVISION * - STRUCTURAL GLUED LAMINATED TIMBER
    ------------------------------------------------------------------

10                          STRUCTURAL GLUED LAMINATED TIMBER
    ------------------------------------------------------------------

11              DIVISION I - STRUCTURAL GLUED LAMINATED TIMBER
                             AND HEAVY TIMBER ROOF DECKING
    ------------------------------------------------------------------

12              DIVISION * - STRUCTURAL GLUED LAMINATED TIMBER
                             AND HEAVY TIMBER ROOF DECKING
    ------------------------------------------------------------------

13                          STRUCTURAL GLUED LAMINATED TIMBER
                             AND HEAVY TIMBER ROOF DECKING
    ------------------------------------------------------------------

14                     DIVISION I - HEAVY TIMBER ROOF DECKING
    ------------------------------------------------------------------

15                     DIVISION * - HEAVY TIMBER ROOF DECKING
    ------------------------------------------------------------------

16                                 HEAVY TIMBER ROOF DECKING
    ------------------------------------------------------------------

17  GENERAL NOTES
    -------------

REFER TO

18  DRAWINGS
19  SCHEDULES
20  DETAILS
21  ALTERNATES DIVISION
22  ADDITIONAL SPECIFICATIONS ON DRAWINGS
23  REFERENCED STANDARDS
24  REFERENCED SPECIFICATIONS
25  REFERENCED CODES
26  ELECTRICAL DRAWINGS AND SPECIFICATIONS
27  PLUMBING DRAWINGS AND SPECIFICATIONS
28  MECHANICAL DRAWINGS AND SPECIFICATIONS
```

PHRASES 1 - 28
SEC 1480 PAGE 1

*Fig. 2A*

```
GENERAL NOTES, STANDARDS, SHOP DRAWINGS
---------------------------------------

29      * DRAWINGS AND SPECIFICATIONS
30      EQUIPMENT SHOP DRAWINGS BEARING APPROVAL STAMP OF
31          ARCHITECT
32          ENGINEER
33          OWNER
 5          *
34      APPROVED SHOP DRAWINGS FOR WORK PERTINENT TO THIS WORK
 4      *

35   LAWS, ORDINANCES, RULES, REGULATIONS
     -------------------------------------

COMPLY WITH THOSE IN EFFECT AT SITE, INCLUDING

36      CITY BUILDING CODE
37      CITY ORDINANCES
38      VILLAGE ORDINANCES
39      FEDERAL HOUSING AUTHORITY REQUIREMENTS
40      DEPARTMENT OF HOUSING AND URBAN DEVELOPMENT REQUIREMENTS
41      STATE RULES AND REGULATIONS FOR FIRE PREVENTION, ETC.
42      STATE STANDARDS FOR THE CONSTRUCTION OF SCHOOLS
43      NATIONAL BUILDING CODE
44      UNIFORM BUILDING CODE
45      B.O.C.A. BUILDING CODE
 4      *

46   STANDARDS AND INDUSTRY SPECIFICATIONS
     -------------------------------------

DEFINITIONS OF SUCH USED HEREIN ARE AS FOLLOWS

47      A.I.A.       AMERICAN INSURANCE ASSOCIATION
48      A.I.S.C.     AMERICAN INSTITUTE OF STEEL CONSTRUCTION
49      A.I.T.C.     AMERICAN INSTITUTE OF TIMBER CONSTRUCTION
50      A.S.T.M.     AMERICAN SOCIETY FOR TESTING AND MATERIALS
51      A.W.P.A.     AMERICAN WOOD PRESERVER'S ASSOCIATION
52      A.W.S.       AMERICAN WELDING SOCIETY
53      C.S.         COMMERICAL STANDARDS
54      F.S.         FEDERAL SPECIFICATIONS
55      H.D.G.A.     HOT DIP GALVANIZER'S ASSOCIATION
56      N.F.P.A.     NATIONAL FIRE PREVENTION ASSOCIATION
57      U.L.         UNDERWRITER'S LABORATORIES
58      A.N.S.I.     AMERICAN NATIONAL STANDARDS INSTITUTE
59      U.S.D.C.     UNITED STATES DEPARTMENT OF COMMERCE
60      U.S.W.D.     UNITED STATES WAR DEPARTMENT
 4      *

61   SAMPLES
     -------

IN ACCORDANCE WITH SUPPLEMENTARY GENERAL CONDITIONS, SUBMIT
     AS FOLLOWS

62      FOR EACH NON-MASTIC MATERIAL REQUIRING

PHRASES 29 - 62
                                            SEC 1480 PAGE 2
```

```
I N T R A  -  S P E C                                                PAGE   1
COMPUTER SERVICE, INC                                                07-07-71
-------------------------------------------------------------------------------

FIRM NAME...PHILLIPS AND ASSOC.
        SPECIFIER...CWP
        PROJECT.....INDUST.   817
        DATE........11-18-70

INSTRUCTIONS REQUESTED -
                DRAFTING

1...BOT INDUSTRIAL COMPLEX 'A'   TULSA, OKLAHOMA
  2...DIV1480 08
  3...SEC1480
  4...    17 18 19 20 21 22 23 25 26 27 28 30 31 34 35 38 43
  5...    46 49 50 51 53 54 47 56 58 59 78 79 80 02 81 82 83
  6...    85 87 88 81 89 83 92 87 93
  7...SEC1485
  8...    08 09 10 20 10 21 22 23 24 25 26 27 28 30 31 32 33
  9...    34 01 36 37 38 39 40 41 42 44 47 48 49 50 52 44 53
 10...    43 54 55 58 59 60 61 68 69 70 72 73 74 75 76 77 80
 11...    81 83 84 85 86 89 86 93 94 95
 12...SEC1490
 13...    08 09 12 27 29 12 15 18 19 24 26 30 12 31 32 33 34
 14...    35 36 37 40 41 42 43 44 45 48
 15...SEC1495
 16...    08 10 13 14 15 17 22 24 26 27 28 30 02 34 02 33 36
 17...    37 38 45 50 42 53 56 58 61 65 68 88 91 92 01 93 96
 18...    97 11 03 28 29 36 37 38 43 53 54 58 59 65 66 88 91
 19...    92 01 94
 20...SEC1500
 21...    12 15 16 17 18 19 26 27 28 4( )   34 36 13 03 26 30
 22...    02 32 02 31 4( )   34 36
 23...SEC1505
 24...    09 12 16 17 23 25 58 59 02 63 64 74 81 79 95 17 20
 25...    21 29 53 56 58 59 02 62 66 69 74 82 10 97
 26...SEC1510
 27...    08 11 13 17 18 25 23 24 19 20 21 22 26 27 30 31 33
 28...    36 33 38 39 42 44 46 49 51 54 56 58 59 60 61 60 62
 29...    60 65 66 4( )   67 78 81 14 03 30 31 34 36 34 38 40
 30...    42 44 47 49 52 04( )  67 78 81
 31...SEC1515
 32...    09 12 13 14 24 25 26 27 29 31 34 35 37 42 43 44 46
 33...    48 52 59 64 65 66 76 02 77 02 80 83 84 02 85 02 86
 34...SEC1520
 35...    08 09 12 14 15 16 21 4( )   28 29 31 32 01 39
 36...SEC1515
 37...    10 03 29 30 34 5(NONE REQUIRED)
 38...SEC1520
 39...    15 16 18 4( )   28 29 30 32
 40...SEC1550
 41...    08 10 01 11 14 15 16 17 18 19 20 21 22 23    26 01
 42...    27 14 15 29 30 31 19 32 33 34 35
 43...END

JOB ACCEPTED
```

Fig. 4

```
DIVISION I - STRUCTURAL GLUED LAMINATED TIMBER                    PAGE  1      | 1
--------------------------------------------------------------------------------|
            ╱⁴¹                                              ⁴²╲               |
 1         │   GENERAL NOTES                                                    | 17
           │   ---------------                                                  | 17

2             REFER TO                                                         | 17

3                DRAWINGS                                                      | 18
 4                SCHEDULES                                                     | 19
 5                DETAILS                                                       | 20
 6                ALTERNATES DIVISION                                           | 21
 7                ADDITIONAL SPECIFICATIONS ON DRAWINGS                         | 22
 8                REFERENCED STANDARDS                                          | 23
 9                REFERENCED CODES                                              | 25
10                ELECTRICAL DRAWINGS AND SPECIFICATIONS                        | 26
11                PLUMBING DRAWINGS AND SPECIFICATIONS                          | 27
12                MECHANICAL DRAWINGS AND SPECIFICATIONS                        | 28
13                EQUIPMENT SHOP DRAWINGS BEARING APPROVAL STAMP OF             | 30
14                   ARCHITECT                                                  | 31
15                APPROVED SHOP DRAWINGS FOR WORK PERTINENT TO THIS WORK        | 34

16             LAWS, ORDINANCES, RULES, REGULATIONS                             | 35
               ------------------------------------                             | 35

17             COMPLY WITH THOSE IN EFFECT AT SITE, INCLUDING                   | 35

18                VILLAGE ORDINANCES                                            | 38
19                NATIONAL BUILDING CODE                                        | 43

20             STANDARDS AND INDUSTRY SPECIFICATIONS                            | 46
               -----------------------------------                              | 46

21             DEFINITIONS OF SUCH USED HEREIN ARE AS FOLLOWS                   | 46

22                A.I.T.C.      AMERICAN INSTITUTE OF TIMBER CONSTRUCTION       | 49
23                A.S.T.M.      AMERICAN SOCIETY FOR TESTING AND MATERIALS      | 50
24                A.W.P.A.      AMERICAN WOOD PRESERVER'S ASSOCIATION           | 51
25                C.S.          COMMERICAL STANDARDS                            | 53
26                F.S.          FEDERAL SPECIFICATIONS                          | 54
27                A.I.A.        AMERICAN INSURANCE ASSOCIATION                  | 47
28                N.F.P.A.      NATIONAL FIRE PREVENTION ASSOCIATION            | 56
29                A.N.S.I.      AMERICAN NATIONAL STANDARDS INSTITUTE           | 58
30                U.S.D.C.      UNITED STATES DEPARTMENT OF COMMERCE            | 59

31             SHOP DRAWINGS                                                    | 78
               -------------                                                    | 78

32             IN ADDITION TO REQUIREMENTS OF SUPPLEMENTARY GENERAL CONDITIONS, | 78
33             COMPLY WITH FOLLOWING                                            | 78

34                PRINT TYPE                                                    | 79
35                   OPAQUE                                                     | 80
36                   OR                                                         |  2
37                   TRANSLUCENT                                                | 81
38                      FOR SIZES UP TO AND INCLUDING                           | 82

INDUSTRIAL COMPLEX 'A'                                        TULSA, OKLAHOMA
```

*Fig. 5*

```
INSTRUCTIONS TO DRAFTSMEN
DIVISION I - STRUCTURAL GLUED LAMINATED TIMBER            PAGE  2
_____

LAWS, ORDINANCES, RULES, REGULATIONS
------------------------------------

OBTAIN COPIES OF FOLLOWING FROM PLANNING DEPARTMENT, CHECK
DISTANCE FROM HEAT-PRODUCING DEVICES, ROOF LOADS, WIND LOADS,
ALLOWABLE STRESSES
   VILLAGE ORDINANCES
   NATIONAL BUILDING CODE

STANDARDS AND INDUSTRY SPECIFICATIONS
-------------------------------------

IF YOU NEED ABBREVIATIONS FOR ASSOCIATIONS OR INSTITUTES,
SEE SPECS

MATERIALS AND USE LOCATIONS
---------------------------

LUMBER 'A'

SPECIE SPECIFIED IS
      DOUGLAS FIR (COAST REGION)
         OR
      WESTERN LARCH
         OR
      WEST COAST HEMLOCK
   WORKING STRESSES FOR COMPLETED MEMBERS, PSI, IS
      FOR DRY CONDITION OF USE (SEE AITC 102 FOR DEFINITION)
         EXTREME FIBER IN BENDING
            2400
         COMPRESSION PARALLEL TO GRAIN
            2000
         HORIZONTAL SHEAR
            0165
         COMPRESSION PERPENDICULAR TO GRAIN
            0385
         MODULUS OF ELASTICITY
            1,800,000

LUMBER 'B'

SAME AS PRECEDING, EXCEPT
   SPECIE SPECIFIED IS
     CALIFORNIA REDWOOD
   WORKING STRESSES FOR COMPLETED MEMBERS, PSI, IS
      FOR DRY CONDITION OF USE (SEE AITC 102 FOR DEFINITION)
         EXTREME FIBER IN BENDING
            2200
         HORIZONTAL SHEAR
            0125
         COMPRESSION PERPENDICULAR TO GRAIN
            0325
```

INDUSTRIAL COMPLEX 'A'                                TULSA, OKLAHOMA

*Fig. 5A*

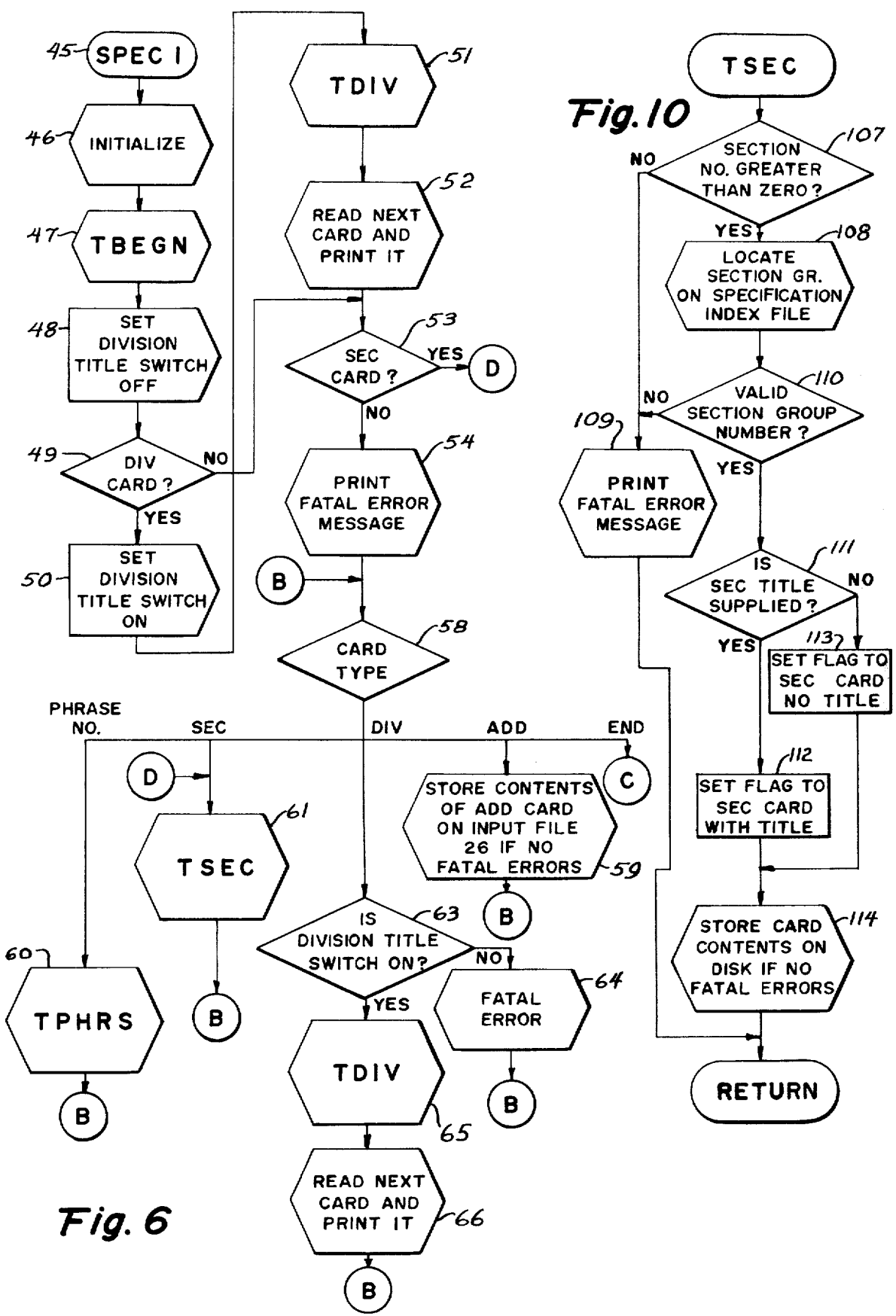

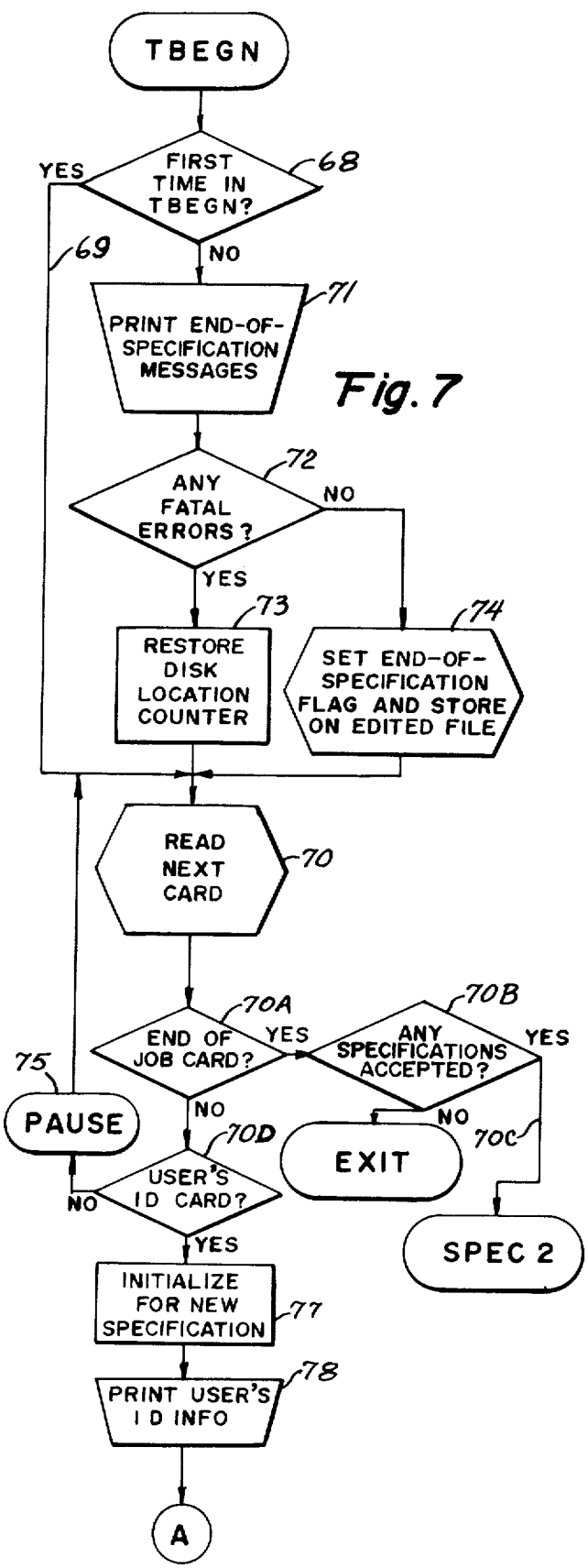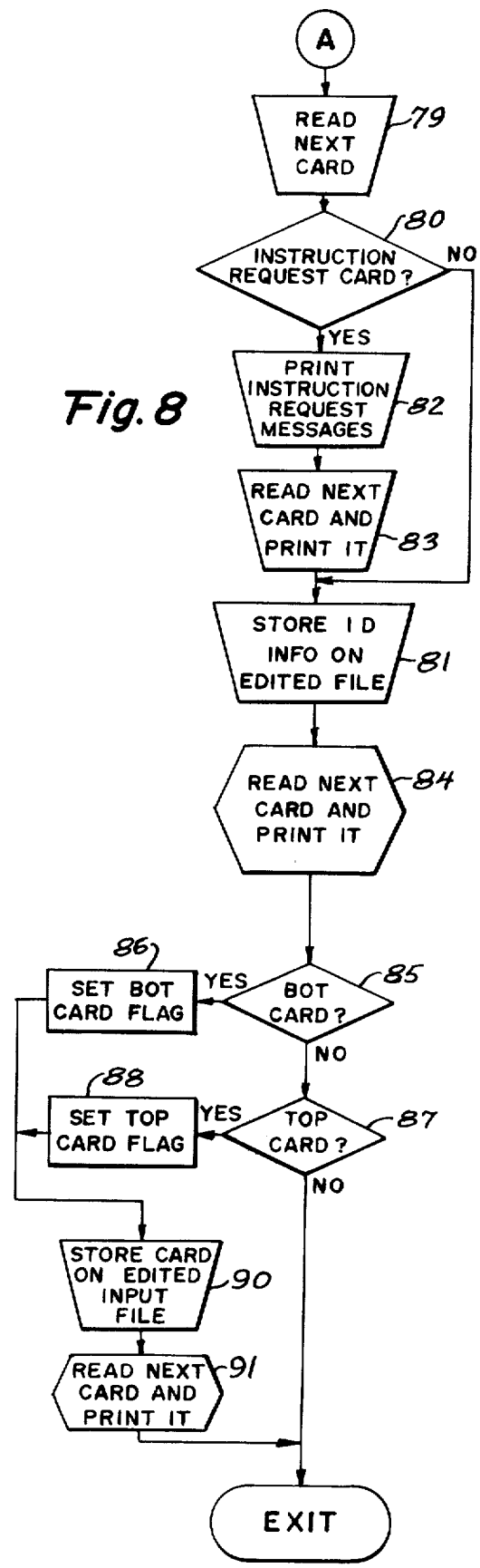

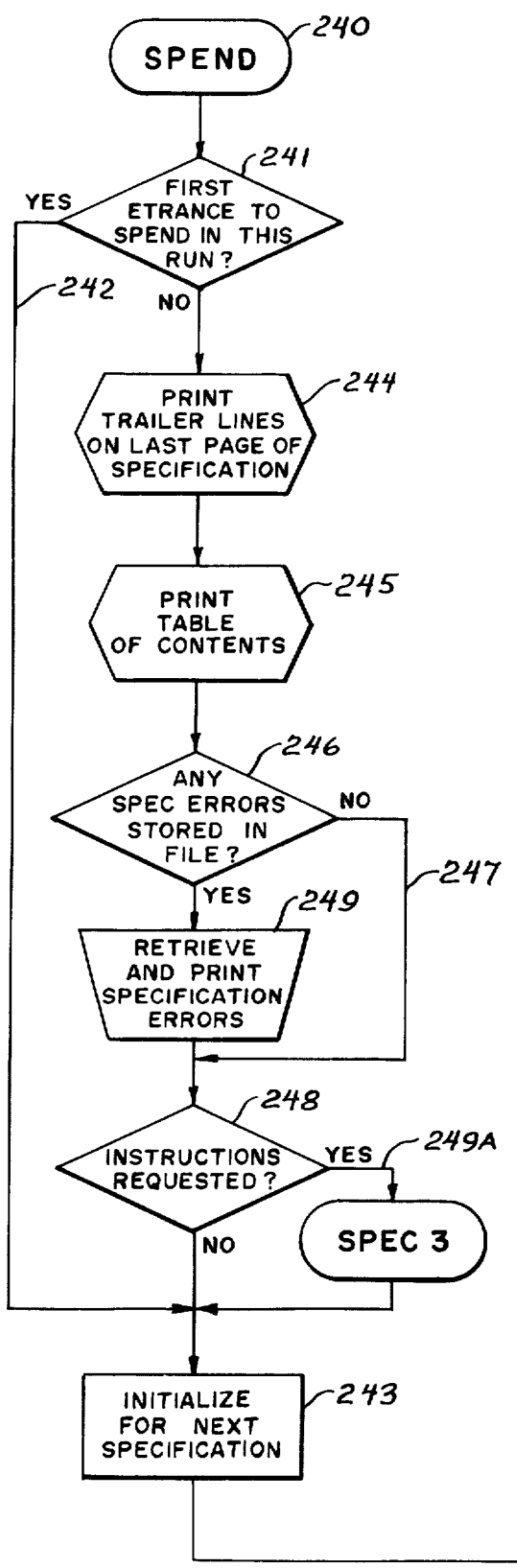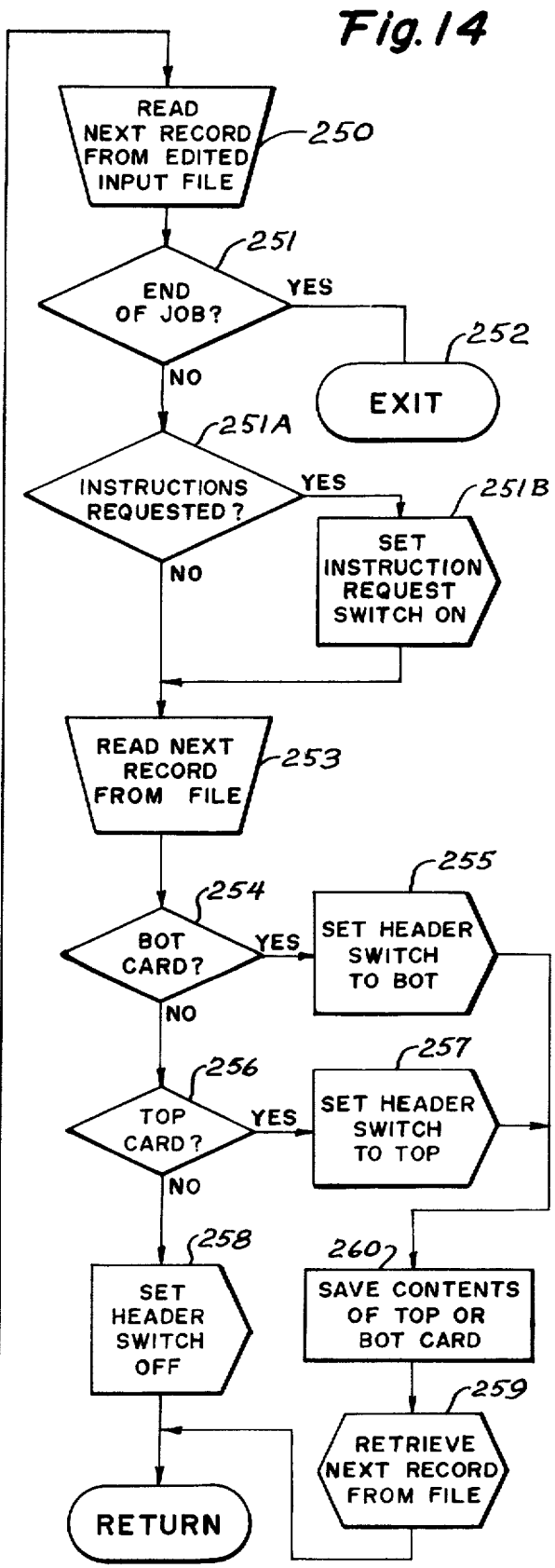
Fig. 14

COMPUTER SYSTEM FOR GENERATING ARCHITECTURAL SPECIFICATIONS AND PROJECT CONTROL INSTRUCTIONS

BACKGROUND AND SUMMARY

The present invention relates to a system for generating a complete set of architectural specifications and correlated instructions, information, and task assignments for various groups of people for constructing a building.

In the past, an architect or specifier hand-wrote a description of materials and construction techniques to produce an architectural specification. Such specifications now may generate sets of instructions, information and work assignments to various groups of people, such as draftsmen, engineers, designers, inspectors, electricians, mechanics, plumbers, etc. Specification writing is extremely tedious and time-consuming because, for a large construction project, an architectural specification may run up to 1,000 pages or more. Further, during planning and preparation of construction drawings, there may be changes; and it is difficult to make such changes and insure that the changes are distributed to all persons involved in the work.

Systems have been suggested for using a computer to assist in the preparation of architectural specifications; however, none of the systems that have been suggested have enjoyed any widespread commercial acceptance. One of the disadvantages found in some of these computer-assisted systems is that the information from which a specification is generated is simply a codification of the language used in handwritten specifications compiled in paragraph form. Thus, a specifier would have to locate a paragraph that conveyed the exact meaning he desired and then specify it. Such systems quickly become unwieldly because of the extremely large information base required to convey the various nuances and different meanings required in an architectural specification. Further, these systems are not easily adapted to the incorporation of new products or changing construction techniques or modifications of the original architectural specifications.

In the present system, a specifier uses brief symbolic characters representative of individual phrases, not sentences or paragraphs, from a large information repository called a Master Phrase Catalog. The phrases in the Master Phrase Catalog are arranged under broad headings called divisions which represent large phases of construction; and the divisions are further subdivided into sections. Each section has an identifying section group number, and it relates to a task or subdivision associated with the major construction phrase or division. Associated with each of the section groups are a number of individual phrases arranged with predetermined indentation to form a final architectural specification in outline form. Associated with each of the individual phrases is a phrase number.

The decision-maker (i.e. specifier) uses a limited number of commands to completely specify a project. He writes the commands out in a code of symbolic characters representative of the major divisions, sections and phrases which constitute the architectural specification. As a result of his selections and commands, and with no further effort on his part, the computer will automatically produce sets of instructions, information, and work assignments for various categories of receivers, as selected by the specifier.

The code written by the specifier is fed into a computer which has all of the information in the Master Phrase Catalog stored on a permanent record file. The computer also has stored an index file correlating the specifier's code with the phrases from the Master Phrase Catalog that will eventually make up the specification.

The computer is programmed to edit the input code composed by the specifier for any errors, and it determines whether the errors are fatal (i.e., those errors which do not permit further processing of the input code). If there are any fatal errors, the program identifies those errors and provides a print-out for the specifier indicating what the fatal errors are.

If there are errors which are not fatal, the input code is processed and a listing is produced of the input code together with an edited input file for further processing to produce the architectural specification. The specification produced by the computer has marginal reference information correlating the listing with the code prepared by the specifier; and this facilitates correction of errors or the introduction of changes into the specification.

After the input code is edited and an edited input file prepared by the first phase of the computer program, the edit input file is then used to produce the final architectural specification including a listing of any errors which may not have been fatal and a table of contents. At the same time, the second phase of the computer program prepares a separate file to be used as an input file for phase 3 of the program which produces the instructions, information and work assignments. A record of all possible instructions is stored in the file in the computer and a separate file serving as an index to the main instruction file is also stored in the computer. The computer program utilizing the instruction input file produced by phase 2 of the program produces the sets of instructions, etc. from the instruction index file and the instruction data file.

By limiting the number of commands available to a specifier (there are only five such commands in the disclosed embodiment) and by using simply symbolic characters as the code, it is possible to introduce a specifier to the present system without having him understand any of the intricacies of computer programming. This feature facilitates introduction and utilization of the present system by the architectural community. That is, rather than making a computer programmer into an architect, the present system, with little effort, turns an architectural specifier with all of his background information into a computer programmer on a very elementary level.

One of the permissible commands enables a specifier to compose and insert his own text into the architectural specification; and this adds to the flexibility of the system. By arranging the Master Phrase Catalog and its associated specification data file into a number of discrete, concise phrases, as distinguished from sentences or paragraphs, adapted to be selected and arranged by the specifier in appropriate sequence, the system can be updated easily to include new products, new construction techniques or new instructions to personnel by deleting or changing one line. Because the corresponding information is stored in a computer, the updating process takes a minimum of time and thus enables the specifier to include the latest material or newest techniques in his final architectural specification. This further eliminates the time-wasting cut and paste or text editing requiring searches through old material that were inherent in earlier methods of preparing architectural specification. The present system further reduces the volume of the final architectural specification through the use of individual phrases compiled in outline form, in relation to prior systems which used specification paragraphs to set forth techniques and materials.

By including simple, symbolic characters of the phrases recorded in the Master Phrase Catalog, a specifier may produce an architectural specification with relatively little handwriting or typing.

One of the more important features of the system is that it enables a specifier to produce sets of instructions merely by checking one code block on the order form. These instructions, information and work assignments may be for the draftsmen, the engineers (such as electrical, mechanical or plumbing) contract administrators, color coordinators or others. Each of these sets of instructions is composed of individual phrases prepared beforehand and stored on a data file. The final listing is specifically related to the phrases and code in the Master Phrase Catalog selected by the specifier. Therefore, it is insured that the instructions given to the various construction personnel will exactly reflect the decisions of the specifier, because they are related to the phrase numbers he chooses from the Master Phrase Catalog.

Other features and advantages of the present invention will be apparent to persons skilled in the art from the following detailed description of a preferred embodiment accompanied by the attached drawing.

THE DRAWING

FIGS. 2A and 2B are sample pages from the Master Phrase Catalog;

FIG. 3 is an order form on which the input code is written by a specifier;

FIG. 4 is a print-out of the edited input code listing prepared by the program computer;

FIG. 5 is a print-out of one page of an architectural specification prepared according to the present invention;

FIG. 5A is a print-out of one page of a set of instructions to the draftsmen prepared by the system of the present invention; and FIGS. 6–10, 10A, 11–20 are information and data flow charts describing a computer program incorporated in the present invention.

DETAILED DESCRIPTION

Figure 1:
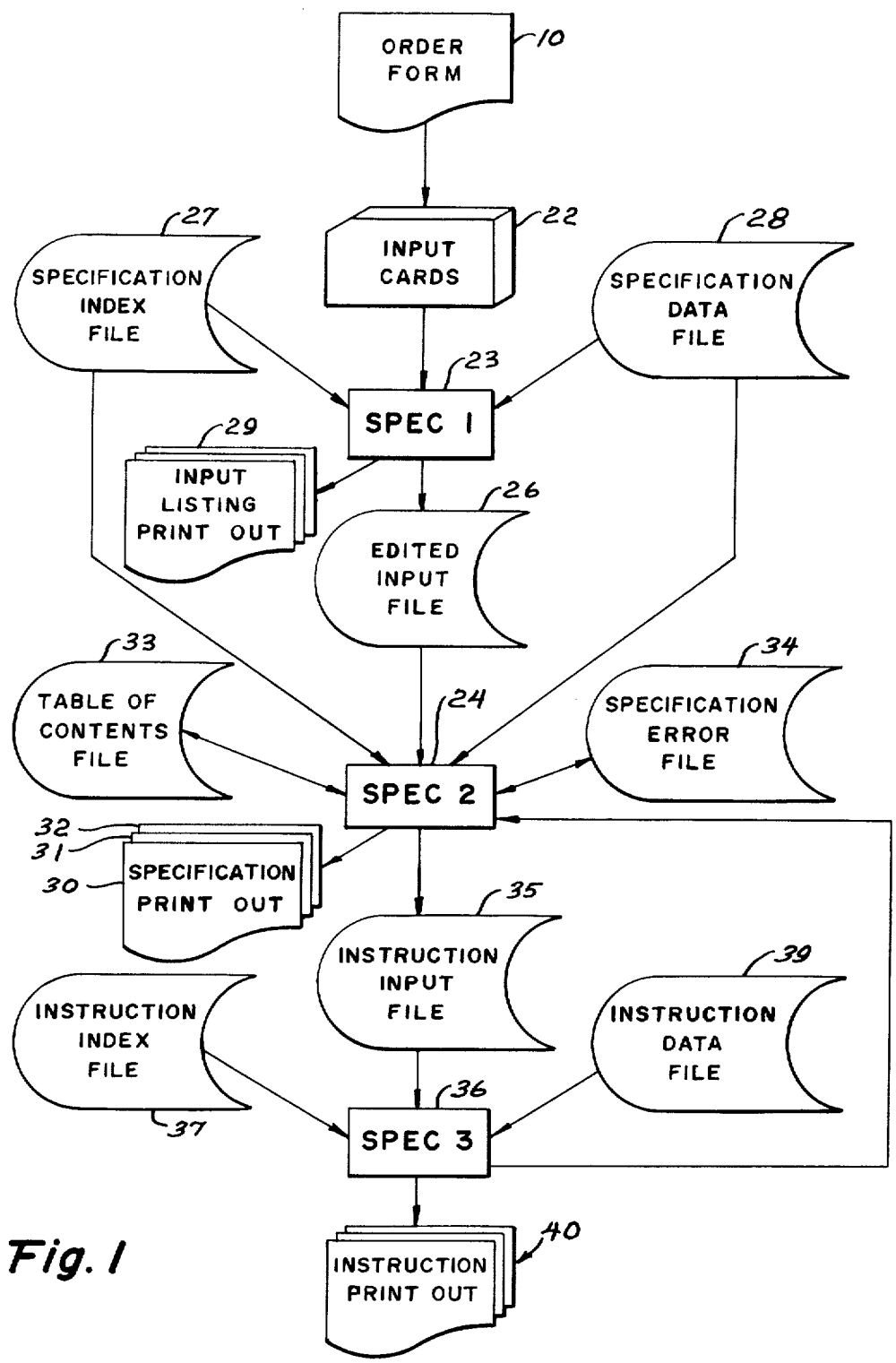
FIG. 1 is a system diagram incorporating the present invention.

Turning first to FIG. 1, a generalized description of the overall system and its components will be given before proceeding into a detailed description of the computer program. The block designated by reference numeral 10 in FIG. 1 is an order form on which a specifier writes or types the symbolic characters (alphanumeric) representative of the materials, techniques and instructions, if any, that he desires to be incorporated into the final architectural specification. The Master Phrase Catalog is a large, constantly changing syllabus or repository of phrases arranged in pre-paragraphed form so that upon proper selection of phrases, the final architectural specification will be arranged in outline form. The Master Phrase Catalog, as it actually exists, is divided into a number of separate volumes, any one of which is too large for a complete description here. Further, because of the nature of the Master Phrase Catalog, a complete description is not necessary for understanding of the invention.

The Master Phrase Catalog is arranged according to subject matter into a number of divisions, each division representing a different step or phase in the construction techniques or building materials that go into forming a large construction project. For example, there are division headings entitled "Acoustic Ceilings", "Carpentry and Millwork", "Insulating Roofdeck", etc. The number and titles of each of these divisions, is, of course, arbitrary; however, the more detailed and realistic the division titles, the more useful the overall system will be.

Each division of the Master Phrase Catalog is further subdivided into what is referred to as "sections". Associated with each section of the Master Phrase Catalog is a Section Group Number. Within each section, there are a number of phrases, and associated with each phrase is a code called a "Phrase Number". In the embodiment illustrated there are four digits (although any alpha-numeric or other symbol could equally well be employed) identifying each section group number, and there are one or two digits identifying each phrase within a section. That is, a Section Group Number is a four-digit number, whereas a phrase number is a two-digit number.

Referring now to FIGS. 2A, 2B, there are shown two sample pages, taken in sequence, from the Master Phrase Catalog. By way of explanation, the area being specified is the section group, "General Notes, Standards, Shop Drawings", as indicated at the top of FIGS. 2A and 2B. On the left-hand side are the phrase numbers arranged in sequence, the column of phrase numbers in FIG. 2A being generally designated by reference numeral 11. The topic here is what has been referred to as a Section Group of the Master Phrase Catalog, and it is designated by the Section Group Number 14A, as indicated generally by reference numeral 12 in the lower right-hand corner of FIG. 2A.

The first seven phrase numbers for this Section Group are, in general, the same for all Section Groups since they are of general use. Following these phrase numbers, there are a number of titles which may be arranged as division titles in the final architectural specification, as will be made clear subsequently. Following this, there are, in sequence, a number of separate phrases, up to 99, each associated with its own Section Phrase Number, and containing a phrase that has been found to be useful in preparing an architectural specification.

Figure 3:
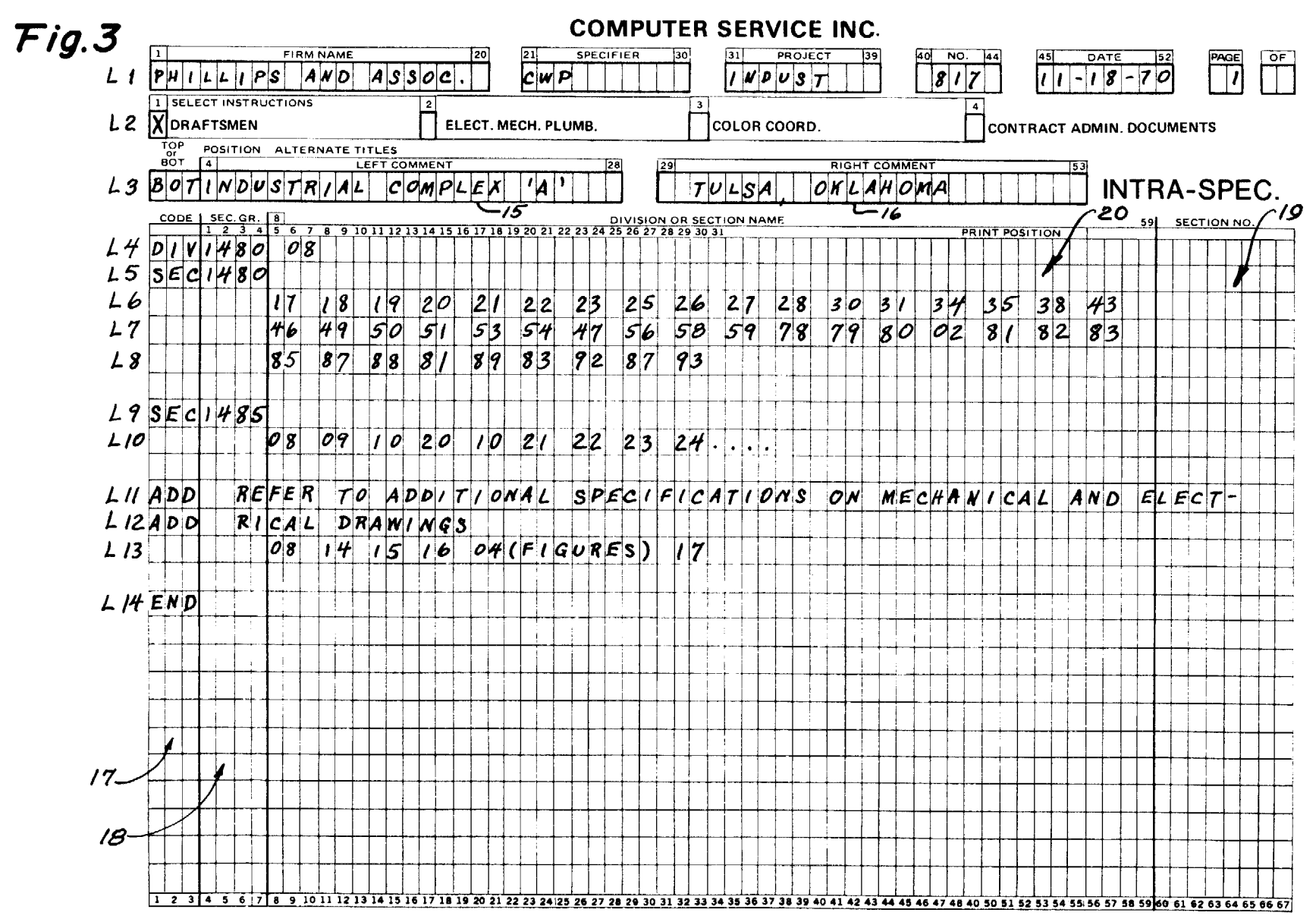

Turning now to FIG. 3, there is shown an order form which is designed to facilitate preparation of an architectural specification by a specifier. Parts of this particular order form have been filed out for illustrative purposes. In the left-hand margin of FIG. 3, there are a series of designations, L-1 through L-14.

In the top line of the order form, L-1, the specifier identifies the project which is not printed in the final architectural specification. In the second line, L-2, the specifier indicates in the respective blocks whether instructions are required for draftsmen, electrical, mechanical and plumbing, color coordination, or contract administration. More lists of instructions or lists other than those shown could be used. If the specifier puts an X in any one of these blocks, it indicates that he wants an appropriate set of instructions to be prepared. Once he makes this selection, however, he need do nothing more to prepare the instructions. For each phrase number he selects from the Master Phrase Catalog, the computer will not only retrieve the associated phrase from storage according to the code written down by the specifier, but it will search through an instruction index file for that phrase number to see whether there are any prepared instructions corresponding to it for the sets of instructions desired by the specifier. If there are corresponding instructions, they will be printed out on separate booklets.

After this preliminary information is indicated on the order form, the specifier then selects one of a predetermined number of commands to prepare the final specification. In the illustrated embodiment, there are five separate commands that he may use. One of the commands is used only in the preliminary information at line L-3. This is the TOP/BOT command. The commands will now be described individually.

TOP/BOT COMMAND

This command is optional, and as mentioned, it is written in the first three spaces of the line L-3. It determines whether the information entered into the blocks immediately to the right of it will be printed at the top or the bottom of each page of the printed final specification. This block is generally designated by reference numeral 15, and to the right of it, there is a separate block designated 16 which contains information which will automatically be aligned with the information in block 15. On the printed file specification, the information in block 15 and the information in block 16 will be adjusted to the left and right margins respectively. A specifier may choose not to use this command at all, and it is not necessary to the operation of the system. If a specifier chooses not to use it, line L-3 is left blank.

DIV COMMAND

The command, DIV, is also optional, and if used, it provides major headings for the final printed specification. A typical DIV command is indicated at line L-4 in FIG. 3. It will be observed that the order form is organized from line L-3 down into a vertical column comprising three character spaces. These character spaces identify the command being used. This column is designated by reference numeral 17 at the bottom. Next from line L-4 down, the order form has a second column comprising four character spaces and designated 18 for the identification of a Section Group Number. Section Group Numbers may be used either in the DIV command or the SEC command to be explained. Proceeding to the right, there is a wide column comprising a large number of character spaces for inserting additional matter or for listing phrase numbers, as will be explained. Finally, to the extreme right, there is a column designated 19 for the insertion of Section Numbers by the specifier. These Section Numbers are arbitrary numbers used in dividing the final specification for a particular project, and they do not bear any relationship to the previously-described Section Group Numbers. That is, the Section Group Numbers are subdivisions within the Master Phrase Catalog, whereas these Section Numbers are subdivisions within a given specification relating to a particular project.

When this command is used, the computer automatically prints the selected title in the table of contents, begins a new page, and prints the title at the top or bottom of each page in that division. There are three different methods of inserting division titles, if they are desired to be used. In the method illustrated in FIG. 3, the specifier has chosen a predetermined title (indicated by the phrase number "08" and found in FIG. 2A to the right of that phrase number. There are, as shown, other predetermined variations of this general topic should the specifier decide to use any of them. Should the specifier decide to use a title not found in the Master Phrase Catalog, he enters DIV in the code spaces (column 17), leaves the Section Group spaces blank (column 18) and prints out his desired title in the large central column, one character per space. Alternatively, the specifier may choose one of the predetermined titles indicated in the Master Phrase Catalog, but he may wish to change the division number. An example is shown in FIG. 2A next to the phrase number 9, wherein the asterisk represents that there is information to be inserted. When there is information inserted, it is designated by such an asterisk, and it is commonly referred to as the "stop code". Information is inserted between parentheses in the central column designated 20 on the order form of FIG. 3. The computer program will print out the division title with the material inserted in the parentheses in place of the asterisk when a stop code is used, and this will be further explained below.

SEC COMMAND

The command, SEC, prepares the computer to read the phrase numbers specified in the column 20 associated with the section Group Number specified in column 18 on the order form of FIG. 3. If the specifier wishes to use phrases or a series of phrases he has selected from any Section Group of the Master Phrase Catalog, he enters the command SEC in the column 17 (see line L-5) he then enters the appropriate Section Group Number under which those phrases are found in the Master Phrase Catalog, and he leaves the rest of that line blank. The phrase numbers are entered on the subsequent lines, L-6 through L-8. This is distinguished from the DIV command in that the phrase number specified in column 20 for the DIV command (line L-4) is printed out as a division title in the final specification.

Lines L-5 through L-10 are representative of a typical "program" prepared by the specifier, the phrase numbers being selected from the corresponding phrases indicated in the Master Phrase Catalog shown in FIGS. 2A, 2B.

If the specifier desires to select a phrase or phrases from another Section Group of the Master Phrase Catalog, he must drop at least one line, enter a separate SEC command in column 17, enter the appropriate new Section Group Number in column 18, drop another line and then enter the selected phrase numbers from that Section Group. This is indicated in lines L-9 and L-10 of FIG. 3.

When it is desired to use section titles as subdivisions within divisions, the specifier enters a SEC command in column 17 together with the appropriate Section Group Number in column 18; he then writes out the title he has selected on the remaining portion of that line (columns 20 and 19 respectively). If he further wishes to use his own individual section numbers, he enters this number in column 19, and it will appear under the page number on the printed specification. If a section number selected for use by the specifier is entered anywhere else on the line, it will be printed as part of the section title on each page of the specification. Section titles will automatically be printed together with their associated section numbers, if any, in the table of contents, and a new page will be started each time a section title is encountered in the printed specification.

Once a section title is entered to begin a new section, that section title will continue through the specification until the specifier enters a new section title or a division title, in the manner described. The use of additional phrases from other Section Group Numbers, as described in connection with lines L-9, L-10, will not affect the continuity of a section title. However, as will be described, a new Section Group Number will prepare the computer to print the phrases selected from that new Section Group, and it will also appear as marginal reference material for the specifier in the edited input listing prepared by the computer for purposes of corrections or modifications.

ADD COMMAND

When a specifier desires to insert lines of text into the specification of his own choosing, he enters a command, ADD, in column 17 and inserts the material to be added in the remaining spaces of columns 18, 20 and 19, adjusting for the desired indentation. That is, the indentation of phrases in the Master Phrase Catalog are pre-determined, whereas there are no pre-set indentations for additions; however, by marking off the character spaces in the left-hand margin, the specifier determines the indentations for himself. A typical ADD command is illustrated in lines L-11 and L-12 of FIG. 3.

END COMMAND

When a specifier has completed a specification, he enters the command, END, in column 18, and this will indicate to the computer program that a specification is finished.

STOP CODE

As already mentioned, the stop code is intended for the insertion of material by the specifier; and in this sense, it is similar to the ADD command. The stop code is designated by an asterisk in the Master Phrase Catalog, and it may appear either as a separate phrase number such as the phrase numbers 4, 5, 6 and 7 (each for different indentation), or in the middle of a phrase, such as in connection with the division title described above. In either case, the information desired to be entered is included between an open and a closed parenthesis on the order form. The parenthesis will not appear on the printed specification.

Returning now to FIG. 1, after the specifier has filled out as many order forms of the type illustrated in FIG. 3 and using the commands and stop code explained above, a keypunch operator punches out the information on conventional input cards, as functionally illustrated by the block 22. The cards 22 are then fed into suitable programmed digital computer of any suitable design and manufacture as has the required storage capacity. The invention is not limited to any computer or computer system; however, the embodiment illustrated herein was programmed and executed on an IBM 1130 which system included additional storage by way of rotating disc memories, commonly referred to as Disc Packs.

The main program of a computer system is, for convenience, broken down into three principal sections, and these are designated respectively: SPEC 1 (indicated by block 23), SPEC 2 (block 24), and SPEC 3 (block 25). SPEC 1 is to produce the file 26 which contains all of the input information but which has been edited to identify errors. Thus, the SPEC 1 portion of the program takes the input cards 22 and edits them to determine whether there are any fatal errors. If there are none, it draws upon information stored in a Spec Index File 27 to retrieve the phrase information from a Spec data file 28. That is, the Spec index file 27 has stored in it detailed information relating a specific Section Group Number and phrase number to a storage location in the Spec Data File 28. The Spec Data File is a large memory storing all of the information in the Master Phrase Catalog, including the phrases and the indentation of the phrases for printing. This is such a large file that it has been found useful to use an index file such as the file 27 described above so that the program, in determining whether there are any fatal errors, may quickly search through the smaller Spec Index File 27 to determine whether a given phrase number is valid. Thus, the Spec 1 portion of the program 23 produces an edited input file 26 which will be used to produce the actual architectural specification and instruction lists, if any. The Spec 1 program 23 also produces an input listing print-out 29 showing all of the divisions, Section Group Numbers and phrase numbers used by the programmer, as well as the subject matter added or inserted in stop codes. This is quite useful in checking the accuracy of the program, and before proceeding with a further description of the overall system, reference is made to FIG. 4 which illustrates a typical input listing print-out produced by the Spec 1 portion of the program. The print-out of FIG. 4 down through a portion of the blind number 8 in the left-hand margin is the result of the code listing on the order form of FIG. 3 down through the line L-10 in the left-hand margin. The remainder of the code listings of FIG. 3 are for illustrative purposes, it being realized that the remainder of the print-out listing of FIG. 4 was produced by a more elaborate code listing.

It will be observed, however, from FIG. 4, that the introduction of a new Section Group Number or division begins a new heading, and indented in lines thereafter are the individual phrase numbers selected by the specifier within that Section Group Number. As has been mentioned, a listing like the one shown in FIG. 4 greatly facilitates tracing of certain types of errors that may be identified by the program, either as fatal errors or otherwise.

Returning now to the system diagram of FIG. 1, the Spec 2 portion of the program takes the edited input file 26 and produces the detailed architectural specification, schematically designated by reference numeral 30, together with a set of specification errors 31, if any, and a table of contents 32. The table of contents is accumulated on a file 33 during process for print-out at the end of the Spec 2 portion of the program and, similarly, the specification errors, if any, are accumulated on a file 34 during the running of the Spec 2 portion of the program. In addition, the Spec 2 portion of the program produces an instruction input file if the specifier had indicated that such was desired. The instruction input file is designated by reference numeral 35.

In the Spec 3 portion of the program, indicated by block 36, the program uses the data compiled on the instruction input file 35 by Spec 2, and searches through an instruction index file 37 to look up the location, if any, of the instruction data in an instruction data file 39 corresponding to phrase numbers selected by the specifier. If there are instructions on the instruction data file 39 corresponding to the phrase numbers selected by the specifier in preparing the architectural specification 30, then Spec 3 portion of the program prints out these instructions as it produces the sets of instructions required by the specifier, diagrammatically illustrated at 40.

The instructions stored in the instruction data file 39 are prepared beforehand, and as mentioned, each instruction is related to a particular phrase number in the Master Phrase Catalog although the instruction text does not appear in the Master Phrase Catalog. The instructions have been prepared through long experience in writing architectural specifications, and each instruction may be of an indefinite length, and they are usually in sentence form.

As an example, let it be assumed that a specifier desires to have, along with the printed architectural specification, a set of instructions to the draftsmen and a set of instructions to the contract administrator. Then, going through the Master Phrase Catalog, he selects various phrases in composing the architectural specification. For each phrase number that he writes down in code, there may or may not be a corresponding instruction to the contract administrator and/or a corresponding instruction to the draftsman. Supposing he selects in a Section Group, the Phrase Number 38, corresponding to "village ordinances". This number is then entered on the order form as described and keypunched on a computer card. The phrase number is then processed by the Spec 1 and Spec 2 portions of the program and stored on the instruction input file 35. The phrase "village ordinances" will, of course, appear suitably indebted in the printed specification 30. The phrase number 38 appearing on the instruction input file 35 will be used by the Spec 3 portion of the program to search the instruction index file 37 to see whether there are any instructions to the draftsman or instructions to contract administrator stored there and corresponding to phrase number 38 of that Section Group number. In this particular instance, there would be a corresponding instruction to the draftsman (No. 378) and a corresponding instruction to the contract administrator.

The Spec 3 portion of the program then retrieves the text for these two instructions from the instruction data file 39 and prints it out on the instruction print-out 40. It is a feature of the invention that the two instructions may contain separate text. For the example given, the instruction to the draftsman is "check all drawings to insure conformation with village ordinances" and the corresponding instruction to the contract administrator is "village ordinances are in effect on sight, insure all laws are adhered to."

Thus, the system of the present invention will automatically prepare separate sets of instructions to draftsmen and construction personnel, if requested by the specifier; and these sets of instructions are prepared from data stored in the instruction data file and correlated with the code obtained from the Master Phrase Catalog by the specifier and entered on the order form 10. The specifier need do nothing but enter the code on the order form and thence into the computer via the input cards 22, and the sets of instructions that he called for are automatically printed out as separate booklets.

Turning now to FIGS. 5 and 5A, there are shown sample print-outs of one page of an architectural specification and one page of instructions to draftsmen respectively, which were produced according to the system shown in FIG. 1 and resulting from the code prepared by a specifier as shown in FIG. 3 down through line L-6 and phrase number 82 thereof. It will be observed that the information in block 15 on line L-3 is started at the left-hand margin and the information written in block 16 is flush to the right-hand margin of the page. The specification print-out of FIG. 5 is preferably printed on the conventional type of paper web having left and right-hand sets of marginal apertures for advancing the paper by the printing mechanism and including longitudinal perforation lines indicated respectively at 41 and 42 which, when the marginal perforations are detached, form a page of the size 8½ × 11 in.

The present invention prints the section numbers of the phrases being printed in the main body of the page to the left of the perforation line 41, and the corresponding phrase numbers are printed to the right of the perforation line 42. Thus, when the perforations are removed, the phrase numbers and Section Group Numbers are also removed, but should there be any error, this feature greatly facilitates the location of the Section Group Number and phrase number at which the error occurred.

Detailed Description of Computer Program

The computer program used to implement the system in the illustrated embodiment is not to be taken as a limitation of the scope of the invention. It is a fairly large computer program, having of the order of 4,000 different instructions; and is therefore considered best for the sake of brevity to disclose the program in information flow chart fashion. Toward this end, certain standardized block notations are used, and they will be explained in greater detail as the need arises. Further, the description of the entire program is broken down into the three sections disclosed above, namely, SPEC 1, SPEC 2, and SPEC 3.

Turning then to FIG. 6, the obround symbol 45 signals the beginning or end of the portion of the program, and the particular block 45 indicates the beginning of SPEC 1. The hexagonal block 46 indicates the performing of a subroutine in the program. The particular subroutine 46 at the beginning of FIG. 1 is to perform certain so-called housekeeping procedures such as aligning the printer, reading the date card, setting switches to their original position, setting counters, etc. and persons skilled in the art will readily appreciate the nature of these housekeeping procedures, and this subroutine will not be described in further detail as it is not necessary to an understanding of the invention.

Following the housekeeping subroutine 46 there is a subroutine 47 labeled TBEGN, which will be described in greater detail below. After the subroutine TBEGN is performed, the program sets the division switch to an Off position as indicated by the block 48, which block is a standard symbol for a program switch. Such program switches are normally used to signal the use of and track a predetermined tag. This is followed by a function performed in the diamond-shaped block 49 which is a symbol for a decision block.

In the block 49 the program determines whether the card being processed in a DIV card (or command). If it is, the program sets the Division Title Switch to "on" in block 50 and proceeds to a subroutine TDIV as in block 51 and then reads the next card in 52. If the first card is not a DIV card, the program proceeds to block 53 to determine if it is a SEC card; and if it is a SEC card, it enters a subroutine TSEC, block 61, via connector D.

Further, the card read in block 52 is checked to see whether it is a SEC card. In either event, if the card is not a SEC card at this point, a Fatal Error message is printed out, block 54, and the program proceeds to decision block 58.

In the block 58 the computer determines the type of card the one being processed is. There are six possibilities:
1. A "phrase number" card;
2. A "SEC" card;
3. A "DIV" card;
4. An "ADD" card;
5. An "END" card;
6. None of the above.

If the card being read is none of the first five cards above, it is a fatal error and it is a print-out of this together with a jump to the connector block B leading into the subroutine 57 which reads the next card and prints it on the program listing. Connector point B indicates the reprocessing or the beginning of the main portion of the Spec 1 program. Each of the individual cards except 40 END card will call for the reading of a subsequent card so that the main portion of the program will be re-entered. Thus, proceeding from the decision block 58, if one of the permissible cards indicated by the first five possibilities above is detected, one of the branches indicated in FIG. 6 is followed. If an END card is encountered, the program jumps via the connector circle C back to the subroutine TBEGN as indicated in the subroutine block 47. If an ADD card is encountered, the program enters into a subroutine 59 in which the contents of the card are stored on the edited input file 26 for Spec 2 and held there. It is placed in storage in the file 26 in sequence so that there need be no record kept of it and when there is a print-out of the finalized spec, the contents will automatically be called for. It will be recalled that the principal function of the Spec 1 program is to check the cards for fatal errors, and provided no fatal error is encountered, store the contents of the card on the edited input file 26 for processing by the Spec 2 program. The program then proceeds via the connector circle B to the subroutine 57 which reads the next card and prints it on the listing and back into the main loop of Spec 1 wherein it is determined exactly what type of card is being processed and an appropriate subroutine is entered into. If a phrase number card is encountered, the subroutine TPHRS, indicated by the block 60 is entered, and when it is finished, the program again enters the main loop of Spec 1 via connector circle B. If a SEC card is encountered, the program enters into a subroutine 61 labeled TSEC and when it is finished, the program re-enters the main loop of Spec 1.

If a DIV card is detected, the program first determines whether the DIV title switch is on in the decision block 63, and if it is not, the program enters the subroutine 64 to print out a fatal error message, and thence via connector block B back into the main loop of the program. If the DIV title switch is on as determined by the decision block 53, the program enters into a subroutine 65 entitled TDIV after which the program proceeds to subroutine 54 via the connector block D, which subroutine has been discussed already.

Turning now to the major subroutines that have been indicated above, the first subroutine encountered by the program after the initializing subroutine 46 TINIT is the subroutine 47 TBEGN.

Referring now to FIG. 7, the program enters TBEGN either at the beginning of a specification or at the end of a specification. If it is the first time that the program enters TBEGN as determined by the decision block 68, the program proceeds along line 69 to the subroutine 70 to read the next card, thereby skipping the intermediate processing and from this point on, the program is concerned with processing a new specification. If it is not the first time that the subroutine TBEGN is entered, the program prints an end of specification message as indicated by the input/output block 71 and then proceeds to a decision block 72 which determines whether there have been any fatal errors in the specification just processed. If there had been any fatal errors, the program enters a processing stage indicated by the block 73 which restores the disc location counter to the value at the beginning of the specification. If there had been no fatal errors, the program enters into a subroutine 74 which sets the end of the specification flag and records this on the edited input file 26 of FIG. 1.

As the edited input file 26 is prepared, the program records an increment two separate counter locations, referred to as the "save location" and "current location". The "save location" counter stores the starting locations for the edited input on the file 26—that is, this is a number representative of a storage location on the disc comprising the file 26 which begins SPEC 2 processing if there had not been received a fatal error location. During the processing, the "current location" is incremented, as needed, so that the additional processing is stored in proper sequence for processing by SPEC 2. If during the processing, the program has detected a fatal error, then the function of block 73 is to reset the numbers stored in the "current location" counter to the value of the "save location" counter—that is, the initial counter location is simply transferred to the "current location" counter so that in the event of a fatal error having been detected, the next specification is processed by SPEC 1 in the program and, as it is edited, the edit input of the subsequent specification is recorded on the edited input file 26 into the disc locations which had previously held the defective specification that had been processed prior. If no fatal errors had been detected, the program proceeds to the block 74 which writes a special flag on the disc indicating the end of an accepted specification. In decision block 71, there is determined whether an EOJ card (representing end of job or end of all specifications being processed at that time) is present. If it is, program next determines in block 72 whether any specifications had been accepted. If no specifications had been accepted and all input specifications had been processed, the program exits and does not proceed to SPEC 2. If any input specifications had been accepted, however, the program proceeds via line 73 to the SPEC 2 program.

If there was not an EOJ card present, it represents the fact that a new specification is being processed, and the program decides in decision block 74 whether this card represents a user's identification card. If it does not, the program pauses as indicated by the block 74 to permit the operator to either put in a card indicative of the user or to insert an EOJ card. The program then begins setting up for a new specification with the following functions being performed: (1) it saves a beginning disc location for the new specification; and (2) it prints the user's ID information on the input listing print-out 29, described above.

These are representative respectively by the blocks 77 and 78 in FIG. 7.

Turning now to FIG. 8, the subroutine TBEGN next proceeds to read the next card as indicated by the block 79 and then asks the question in the decision block 80 whether this is an instruction request card. Referring back to the order form of FIG. 3, the specifier would have indicated by one or more X's in the line L-2 which, if any, sets of instructions he desired to be prepared. The existence of an instruction request card is optional, as discussed above; so if it is not present, the program simply skips down to the block 81 to write the identification information into the edited input file 26 for use in SPEC 2. If there was an instruction request card, then the program proceeds to block 82 to print the instruction request message, and then proceeds to block 83 to read the next card and thence to block 81, described above. After this, the next card is read and printed in block 84 and a decision is made in block 85 whether this is a BOT card indicating the existence of a BOT command, described above. If it is, the program enters the processing section 86 to set the flag indicative of the existence of a BOT command. If there was no BOT command, the program proceeds to a decision block 87 to determine whether or not there was a TOP command, and if not, the program exits the subroutine TBEGN. If there had been a TOP command, the program proceeds to a block 88 to set a TOP card flag. If either a TOP or a BOT card had been present, the program then writes the information on the card in the edited input file 26 as indicated by the block 90 and then proceeds to read the next card imprinted as indicated on the block 91, from which the program then exits the subroutine TBEGN.

Figure 9:
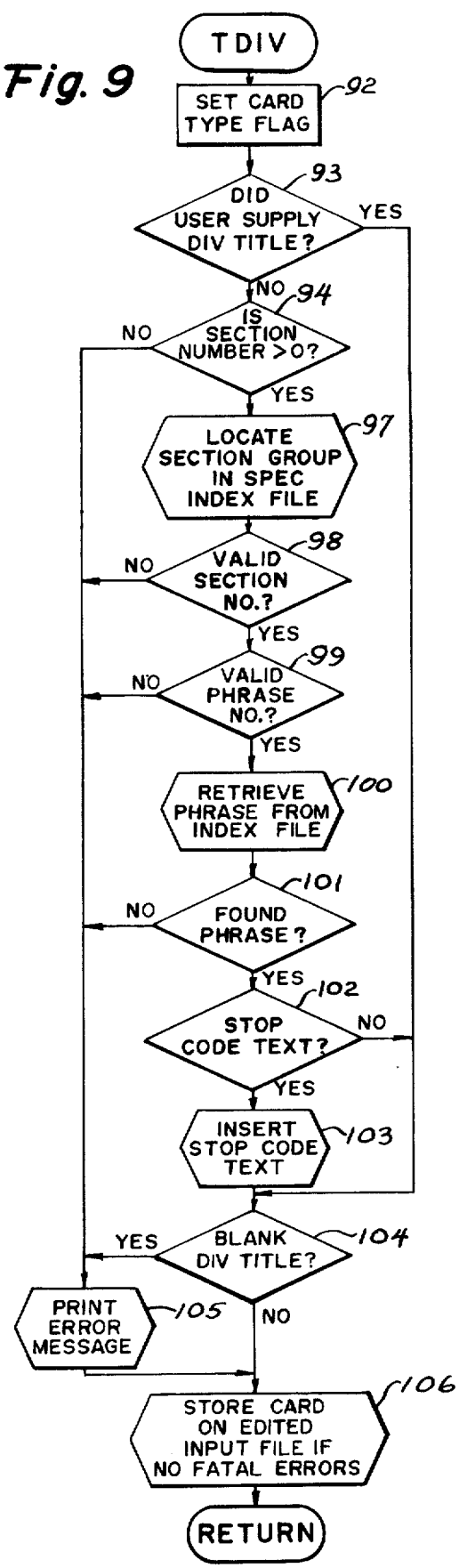

There will now be discussed each of the various subroutines that processes the various types of cards identified and processed in the main loop of the SPEC 1 program. Turning now to FIG. 9, there is shown the subroutine for TDIV. The first thing we do there, in block 92 is to set a flag to show that the program has recognized a DIV card. Actually, this is merely a number representative of the particular type of card that is being read. This flag is written on a disk memory as an identifier of the DIV card.

The next function to be performed in block 93 is to determine whether the specifier has supplied his own division title or whether we use one in the Master Phrase Catalog. If the next four blocks on the order form are filled in, they will be with a Section Group Number and the program will then look up that Section Group Number and use the title found there. If they are not filled in, then the title will be supplied by the specifier and the remaining portions of the order form for that line, for example, line L-4 of the main portion of the order form of FIG. 3 wherein the specifier has called for Section Group Number 1480, phrase number 8. Conversely, the specifier could have added a title without using the section line.

Turning now to the chain of processing, proceeding to block 62 we are going to perform a number of tests to see whether we have valid information. In here, we have detected that the specifier has used the DIV code and a section number. Hence, the block 94, the program checks to see whether the numbers inserted are permissible, although at this time the program has not determined that any such Section Group Number exists. Next, the program locates the Section Group Number on the disk (i.e., in the Spec Index File 27) as in block 97, and determines in block 98 whether that Section Group Number is valid. Secondly, in block 99, the program determines whether the phrase number is valid. If a specifier uses a Section Group Number, he must follow it with a phrase number in order to select a particular phrase as a division heading. After the program retrieves the phrase number from the disk which is the Spec Data File 28 in block 10, it determines in block 101 whether it can find the phrase on the disc; and if it can, it checks (in block 102) it to see whether there is stop code text—material enclosed in parentheses—after the phrase number on the DIV card. If there is no stop code text, the program determines whether there is a valid title and proceeds with the processing. If, on the other hand, there is stop code material to be added to the DIV title, the material is added to the DIV title in block 103, either at an asterisk if there is one in the title gotten from the Master Phrase Catalog or at the end of the title if there is no asterisk.

Thus, if the program has reached input block 104, it has determined that there is a valid title from either one of the three inputs: (1) supplied by user (block 93); (2) stored on Specification Data File 28 in toto (block 102); or (3) Stop Code material inserted (block 103). If the program has determined that there is a DIV code, but that the user has failed to fill in his own title, this is not a fatal error, but the program will let him know that this has happened through subroutine 105.

It will be noted that there are certain subroutines which are major subroutines such as TDIV, etc. which are disclosed in greater detail. However, there are minor subroutines such as the block 105 and the block 103 which are merely filled in with the function that is performed by the program, it being deemed that persons skilled in the art will require no additional disclosure for a complete understanding of the invention.

Proceeding then from either of blocks 104 or 105, the program stores the contents of the card in the Edited Input Disk File 26 in block 106, provided there are no fatal errors; and the program exits the TDIV subroutine.

As a result of the TDIV subroutine, the program has generated a title to be inserted in the output specification, and if there were no fatal errors, it has written that title onto the disc of the Edited Input File 26 which is the disc on which the program prepares the input file to SPEC 2.

Figure 10:
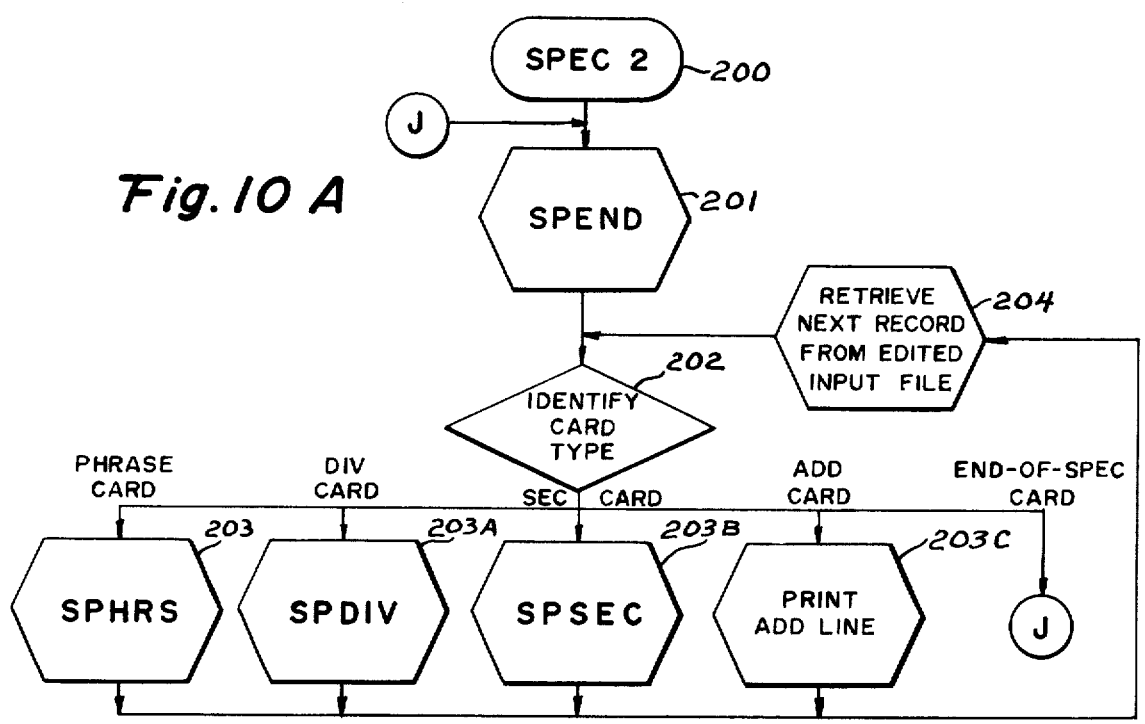

Referring now to FIG. 10, there is shown a flow diagram for the subroutine TSEC (block 61 in FIG. 6). SEC cards come in two varieties. They are used first to identify the Section Group Number from which subsequent phrase numbers will come on the Master Phrase Catalog. At the same time, they can be used to supply a section title, i.e., a title which is minor to the division title. A valid SEC card will always have a section number in the four-space column 18 on the order form of FIG. 3 following the letters SEC in column 17. Whether or not there is a title following the Section Group Number determines which type of SEC card it is.

It will be recalled that the four spaces of column 18 in the order form are reserved for the Section Group Numbers in the case of the SEC command and the DIV command only if a Section Group Number is used, the Section Group Number being optional in the case of a DIV command. In the case of the ADD and END commands the Section Group Number is not used.

Referring to FIG. 10 which shows the TSEC subroutine, the program first processes a card in blocks 107 and 108 to make sure that the Section Group Number being called for is a valid one. It will be remembered that the TSEC subroutine processes a SEC command card.

In block 107, if the specified Section Group Number is not greater than zero, an error message is printed in subroutine 109. In block 108, the program locates the Section Group Number on the disk (i.e., Spec Index File 27); and in block 110 the program determines whether or not that Section Group Number is valid (that is, whether it is really on the disk). The program decides in block 111 whether the user has supplied a section title; and if so, the program sets a card code in block 112 for a section card with a title, and writes the contents of the card in subroutine 114 on the Edited Input File 26 for SPEC 2, if there are no fatal errors. If, on the other hand, the user has not supplied a title, the program sets the card code for a section card without a title, stores a blank title on the Edited Input File 26 and proceeds if there are no fatal errors. The card code or flag is the code put in storage as the contents of a card are stored on the disk file. For example, number 6 represents a SEC command with a title and/or Section Number; and number 7 represents a SEC command with no title. In short, this is simply the flag which each of the command cards requires as a result of the processing in the main loop of SPEC 1. It is also used by SPEC 2 to be examined so that SPEC 2 knows what type of card is being processed.

Proceeding on, then, the program exits from the TSEC subroutine 61 after writing the contents of the card being processed on the disk which stores the Edited Input File for SPEC 2 and incrementing the disk location counter.

A flow diagram is not given for the subroutine TPHRS, block 60, because it is quite simple. This subroutine merely determines that one of the command cards is not present, and then it stores the phrase numbers on the Edited Input File 26 with appropriate identification code for processing by SPEC 2.

Organization of Master Phrase Catalog on Specification Data File

As used herein, a "word" is a computer code of up to two characters with four bits per character. A "record" is a variable number of words stored in memory, and it serves to point to the separation of Section Groups as they are stored on a disk file. A "file" is a variable number of records which are related logically or according to some useful criterion.

The Specification Data File 28, as mentioned, has recorded in it all of the information in the Master Phrase Catalog; and it is, therefore, very large. Physically, the Spec Data File 28 comprises two separate files. It contains 2,000 records because there are 2,000 Section Group Numbers in the Master Phrase Catalog.

The Master Phrase Catalog is stored in the Specification Data File 28 by Section Group Numbers, each Section Group being stored as a unit or "record". To address a Section Group Number, reference is first made to the Specification Index File 27 which contains information specifying the location of each Section Group Number in the Specification Data File 28. Thus, there are some 2,000 records stored in the Specification Index File 27, each record having four words. The first of these words in each record in the Specification Index File 27 is a Section Group Number. The second word is the file number of the Specification Data File 28 where that Section Group Number may be found. That is, since there are two physically separate files comprising the Specification Data File 28, the second word identifies which file or volume the sought-after Section Group Number is located. The third word in the identification is the number of the beginning record of the sought-after Section Group Number in the Specification Data File 28; and the fourth word is the number of the last record allocated to this Section Group Number. The beginning record of a Section Group Number as stored in the Specification Data File 28, is located by consulting the Specification Index File 27.

The Section Group numbers are arranged in multiples of five. Thus, in locating or generating a word representative of a location of a Section Group Number in the Specification Data File 28, the computer takes the Section Group Number and divides it by five. This yields a pointer in the Specification Index File 27 that contains all the necessary specifying information about that Section Group. The computer then reads the record in the Specification Index File, and it contains the four words, as indicated above, needed to locate and retrieve that Section Group in the Specification Data File 28. In summary, a Section Group Number is divided by five and this yields a location on the Specification Index File 27 on which the four necessary words are located for completely identifying the location of the Section Group on the Specification Data File 28.

The first seven records of the Section Group data contained in each Section Group on the Specification Data File 28 define the Section Group phrase displacement table and Section Group name. Each record has 16 words, the first word of the first record identifies the Section Group Number that is being sought. The next 15 words of that record identify the displacement of phrases 9-23 (that is, 15 phrases). The displacement of a phrase is the number of words from the beginning of record 8 of a particular Section Group to the first words of that phrase. No displacement is given for the first eight phrases of a Section Group because phrases 1-7 are the same for every Section Group that is stored in the Specification Data File 28; and this information is stored in the program, while the beginning location of phrase 8 is always known—it is the phrase that begins with the first word of record 8 of that Section Group, and it has a displacement of zero. If for some entry in the displacement table there is not an associated phrase, the value of the displacement is given to be −1. The next four records, after the first, contain words which give the displacement of phrases 24-87. Each of the Section Groups may have up to 99 phrases. The first 12 words of record 6 identify the displacement of phrases 88-99 for that Section Group. The words "phrases" as used here refers to the phrases found in the Master Phrase Catalog and stored in the Specification Data File 28, each of which has associated with it a code used by the specifier.

The final four words of record 6 identify the title or beginning of the Section Group Name, and record 7 identifies the remainder of the Section Group Name.

The first word of a phrase line contains two pieces of information: the phrase number and the number of lines in the phrase. The second word of a phrase line contains a number of machine words (two characters per word) of text in this line of the phrase, the carriage control information, and the amount of indentation required for this line. The carriage control code causes the printer to skip before or after printing a line, or both. Following these two words of coded information comes the line of text, stored two characters per word. If there is more than one line to a phrase, subsequent lines follow the first line with each line having the same two words of coded information before it. The only difference in the coded information for the later lines is that the total number of lines in the phrase is not included.

In summary, SPEC 1 reads and edits the input code listing prepared by the specifier and translated onto punched cards, and prepares a file, the edited input file 26 which will be used by SPEC 2 to prepare the printed architectural specification. Broadly speaking, SPEC 1 accepts a series of input code listings for different projects or jobs in the form of decks of punched cards. These input code listings are checked for errors and placed on a file called the edited input file 26. The program SPEC 2 steps through the edited input file 26 record-by-record, and composes or prepares the final specification from the Specification Index File 27 and the Specification Data File 28. The output prepared by Spec 2, then, is the final printed architectural specification. In addition, SPEC 2 will also produce, if it is requested, an instruction input file 35 which will serve as the input to SPEC 3 which produces the printed instruction lists, as requested.

SPEC 2

Referring now to FIG. 10A, SPEC 2 begins at the block 200 which is symbolic of a program or subroutine start and proceeds to the subroutine 201 entitled SPEND. The subroutine SPEND will be described in greater detail below; it is responsible for determining whether the system has just finished processing one specification and, if so, finishing the end of that specification. It also begins the next specification stored on the Edited Input File 26. After execution of SPEND, the program proceeds to a test block 202. ohis is the central test around which the program SPEC 2 revolves. This test determines which record or "card" type the program has just gotten from the disk and directs the program to the appropriate subroutine to process that card type. In this context, a "card" is a record represented on the data punched on the card. It is, however, stored on a magnetic disk in the Edited Input File 26. Then, depending on the type of card, the programs processes it in one of the subroutine SPHRS denoted 203, SPDIU denoted 203A, SPSEC denoted 203B, Print ADD line denoted 203C, or re-enters SPEND via connector J if an "End of Specification" card is encountered. Once the card has been processed, the program then proceeds to the subroutine numbered 204 to retrieve another record from the disk and continue around the same loop.

If the card is an ADD card, the subroutine 203C is executed, and the remainder of that card is simply printed directly, without even referencing a file.

The subject matter on an ADD card will always be printed out; however, depending upon the user's request for instruction lists, it may also be placed on the Instruction Input File 35 serving as the input to PEC 3.

Figure 11:
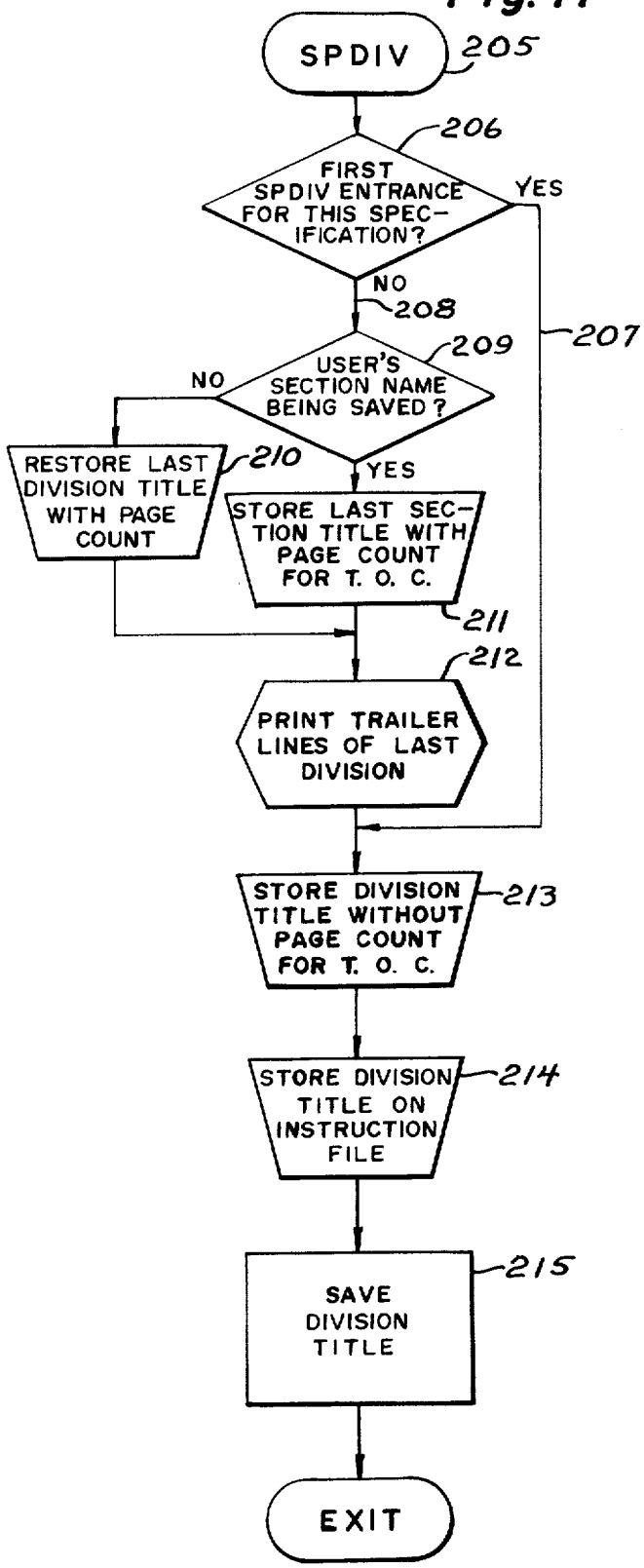

Turning now to FIG. 11, the subroutine SPDIV for handling the DIV card on the specification input.

SPDIV

Before discussing the subroutine SPDIV, the function of the DIV card will be reviewed. The function of the DIV card is to create a title at the top of each page of the printed specification. It also serves to divide the printed specification into divisions at a major level of organization of the specification. There is also a minor level of organization possible, using titles on the SPEC card. The SPEC card then can create sub-sections of a printed (i.e. architectural) specification under a major heading created by a DIV card. Turning now to SPDIV, the subroutine begins in block 205 and proceeds to a first test block 206 which determines if this is the first time that the program has entered this subroutine for the particular specification that is being prepared. If it is the first DIV card for the instant specification, then there is no need to finish off the previous major division so the program branches around via line 207; otherwise, it proceeds via line 208 to finish off the previous division. Proceeding down the line 208, a test block 209 determines whether or not the user has decided to use section titles under his major divisions. If he has, the program records the last section name for the previous division and page count of that section on the Table of Contents File 33. The program builds the Table of Contents file as it proceeds, saving the titles and the page count in the file 33. At the end of each specification, the Table of Contents is printed out.

As mentioned, if the test block 209 has determined that there are section titles, the section titles and their associated page counts are saved and stored on the file SPTOC. If, on the other hand, there are no section titles used, the program saves the previous division title and its page count, and this is stored on the Table of Contents File 33.

This latter function is performed in the I/O block 210. In either case, the program proceeds to the subroutine block 212. This block prints off the trailer line at the bottom of a page, this being the identifier for the previous division. A trailer line is an identification line appearing at the bottom of each page; and if a major division ends in the middle of a page, the printer skips to the bottom of the page and prints the trailer line. Otherwise, the trailer line is printed at the bottom of each page in the case of running text to identify whatever the user had indicated, for example, the job, or the particular division that is being compiled.

After the subroutine 212, the program has finished the housekeeping necessary to wind up a preceding division. Proceeding now to the I/O block 213, the program stores a new Division title on the Table of Contents File 33. Proceeding to the I/O block 214, it is a block that appears on all of the subroutines which determines whether or not the user has requested compilation of an instruction file; and if he has, then the record being worked on it stored on the Instruction Input File 35. In this case, it would be the indication of a division title.

Proceeding now to the processing block 215, the program stores the Division title for subsequent use. Thus, in blocks 213, 214 and 215, the program has stored the division titla in the Table of Contents file 33 in the Instruction Input File 35, if called for, and finally, in the program itself for subsequent use. After this, the program exits the subroutine SPDIV.

SPSEC

Figure 12:
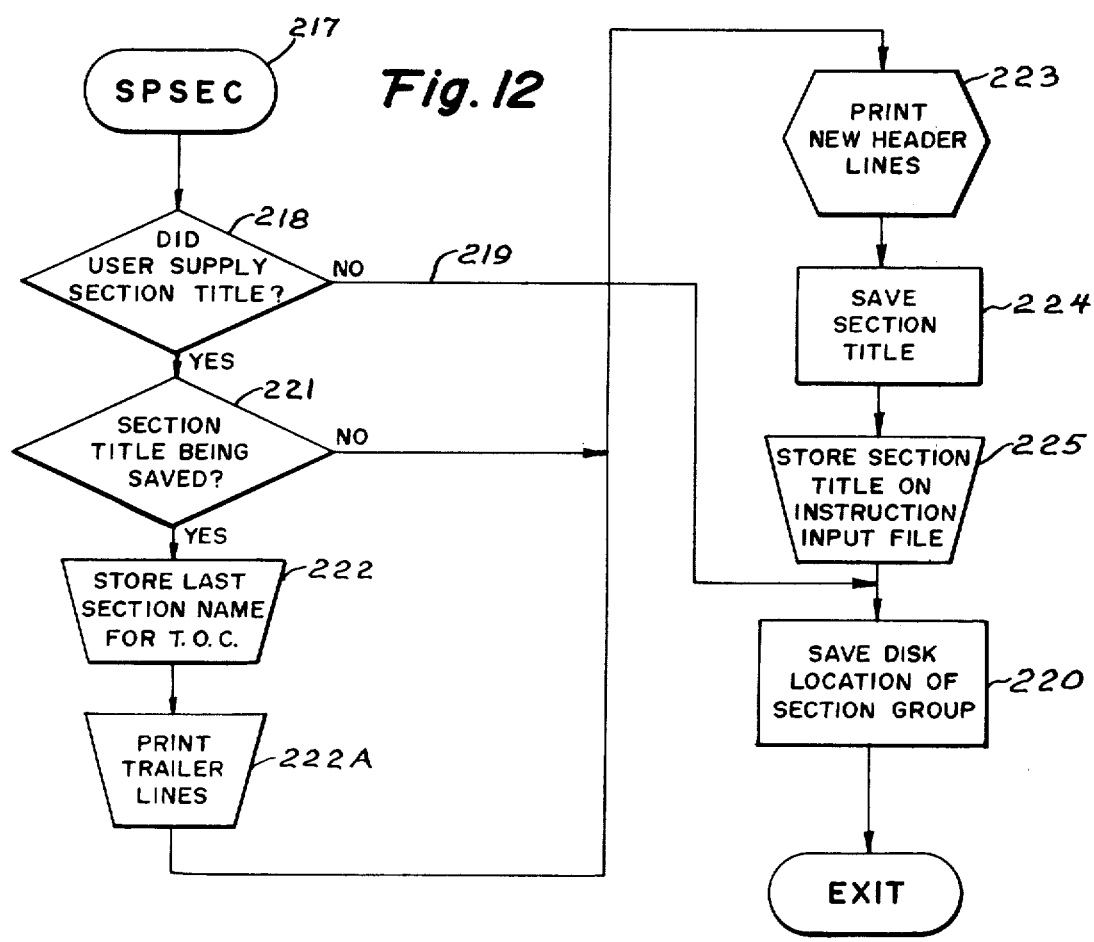

The program proceeds to the subroutine SPSEC denoted 203B in FIG. 10A which processes a SEC card. Referring to FIG. 12, the subroutine SPSEC begins at the terminal block 217 and proceeds to a first test block 218. It will be recalled that there are two types of SEC card. One has a Section Group Number and no title, the other has a Section Group Number followed by a title.

If the user does not specifically add his own title, none is printed out by the program, so that if he has not supplied a Section title, the output of block 218 loops or branches around via line 219 down to the processing block 220. If, on the other hand, he has specified a Section title, the program proceeds to the test block 221 wherein it is determined whether or not there is a section title from a previous section which is being saved. If there is a previous section title being saved, it indicates that there was a preceding section or section information printed out on the specification, so the program saves the section title and page count and prints the final trailer line for the last page. Thus, if there has been a Section title saved, the program proceeds to the I/O block 222 to save the previous Section title and its associated page count on the Table of Contents file and, subsequently, it proceeds to the I/O block 222A to print-out the trailer line or lines.

If there had been no Section title saved, it means that it is the first section in a division or the first section in a specification, but in either case, the program has not been working on a previous section, so it proceeds to the subroutine block 223 which prints the header lines for the next page for beginning a new Section. Each Section and each major Division are begun on new pages. The associated Division title has been stored by the program, so that whenever it skips to a new page, that title will be available for printing. It will be recalled that there is no skip to a new page when processing the Division title.

We then proceed to the processing block 224 wherein the Section title is stored for subsequent use by the program, and then, in I/O block 225, the program stores the Section title on the Instruction Input File 35 as requested by the user. This block illustrates how that file will be prepared.

Finally, the subroutine SPSEC proceeds to the processing block 220 which saves the information retrieved from the Spec Index File 27 by SPEC 1 which represents a location of the associated Section Group in the Spec Data File 28. It will be observed at this time that the program still has not printed out from the Spec Data File 28 which is the stored record corresponding to the Master Phrase Catalog.

However, the program has now stored the location of the Section Group Number on the Spec Data File; and the information stored there is available for producing the printed specification.

SPHRS

Figure 13:
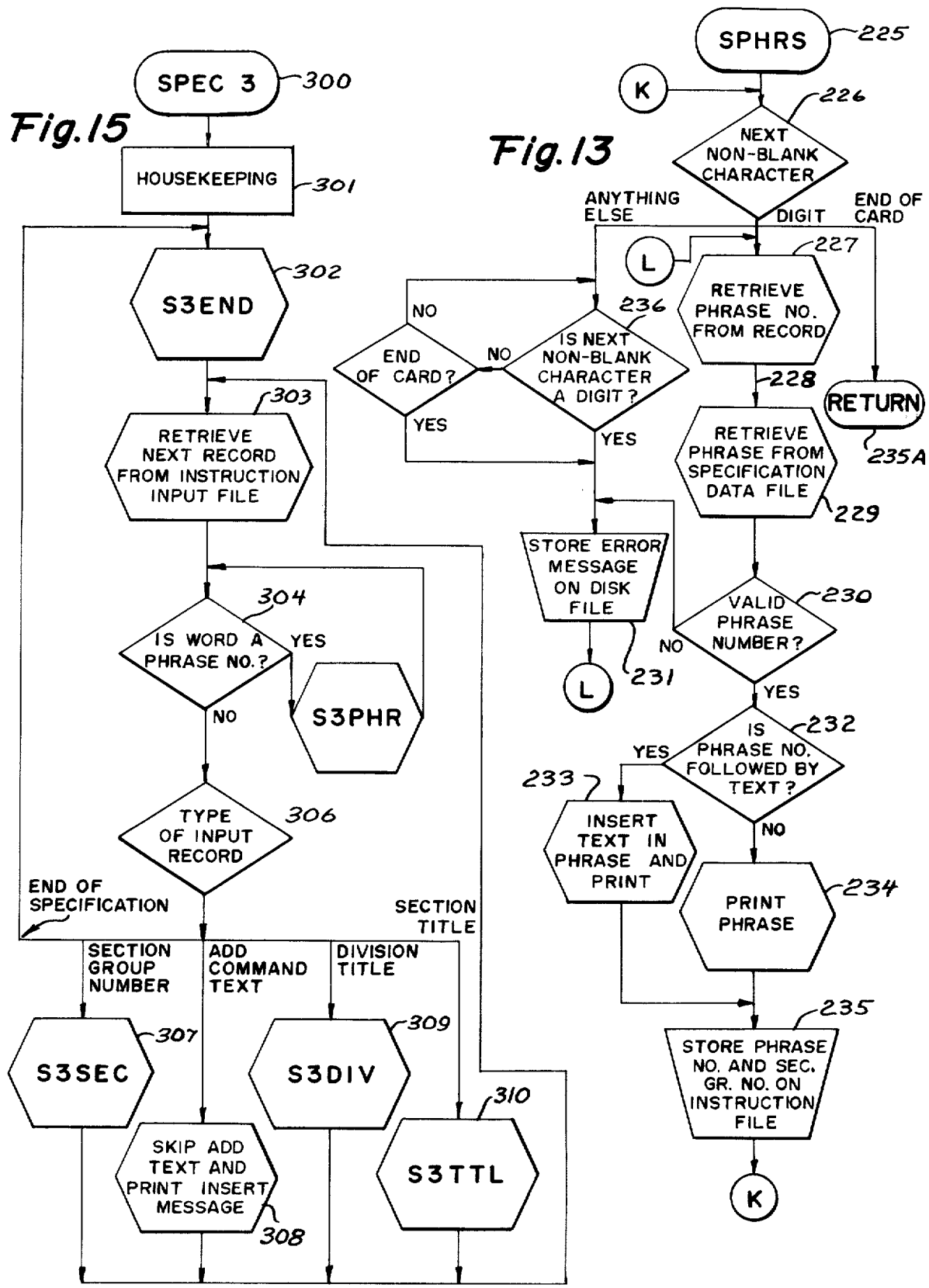

Referring now to FIG. 13, the subroutine SPHRS is illustrated. The subroutine starts with a terminal block 225. The function of this subroutine is to process a Phrase Number card. A Phrase Number card is recognized by the fact that it does not have a command written on it. The information on the Phrase Number card is in free format. That is, it need not have any rigid format of placement on the order form by a user. This routine has to scan the entire contents of a card.

When the program begins to process a Phrase Number card, there are only three possibilities: (1) a digit, (2) the end of a card which is usually sensed by the run-out of the card, and (3) anything else (which is an error).

The reason for this is that a Phrase Number is a group of digits; and in order for there to be any inserted text which would be indicated by a Stop Code, an open parenthesis must be preceded by an associated Phrase Number so that the text can be inserted in that phrase.

Proceeding on with the subroutine, the decision block 226, then determines whether it senses a digit, the end of a card or anything else, as indicated. If it is a digit, the program proceeds to the block 227 which forms a Phrase Number by looking at the subsequent digit locations and seeing whether there is a digit present there or anything else. If there is another digit, then it is appended to the first digit to form a Phrase Number so that a sequence of digits indicates a Phrase Number. Once a Phrase Number is formed, the program proceeds along the line 228 to the subroutine 229 which retrieves the proper phrase from the Spec Data File 28. It will be recalled that the program has already processed a SEC card, so it knows the location on the Spec Data File of the information associated with that Section Group. Now it has obtained a Phrase Number associated with that Section Group, and the computer proceeds right to that Phrase Number which is identified on the Spec Data File and retrieves the information stored subsequent to it.

This subroutine, then, will either retrieve the phrase, or, as indicated by the decision block 230, indicate that it was not a valid phrase number and proceed to the I/O block 131 which stores an error message on the separate Specification Error File 34.

If it had been a valid Phrase Number, the program next wants to find out whether it was followed by any Stop Code text which is to be inserted in the phrase number retrieved from the Spec Data File 28. Stop Code text is indicated by a begin parenthesis, so if the program detects an open parenthesis, in the decision block 232, it proceeds to subroutine 233 and inserts the text prepared by the user into the associated locations in the retrieved phrase. If there is no Stop Code text, the program proceeds to the subroutine 234 and prints the retrieved phrase directly. This branch of the SPHRS subroutine ends in an I/O block 235 in which it saves the Phrase Number and the Section Group Number in the Instruction Input File 35, if the user had requested instructions. After this, the program returns to the top of the subroutine via connector K to look for the next Phrase Number. The Phrase Numbers are separated by blank spaces on the Order Form. Returning to the decision block 226, a counter is set which lets the program know what location it is in while proceeding across the character columns of a card. When it enters the decision block 226, it begins looking for the next non-blank character and, at the same time, for each subsequent character observed, it advances the counter which tells it whether it is at the end of a card. If it is at the end of a card, it exits from the subroutine, indicated by the symbolic block 235A labeled RETURN.

If the program encounters anything but a digit or the end of the card, it enters into a loop started by a decision block 236 which determines whether the next non-blank character is a digit. If it is not a digit, the program tests in the block 237 for the end of a card by looking at the counter, and if it is the end of a card, the program proceeds to the I/O block 231 to store the error message on the Specification Error File 34. If it is not the end of a card the program goes back into a minor loop indicated by the line 239 until it finds the next non-blank character which is a digit at which time it exits the minor loop, stores an error message on the Specification Error File 34, and then stores that digit for processing—that is, it enters the loop at the connector L and processes that digit as though it were the next non-blank character. This ends the description of the subroutine SPHRS.

SPEND

A description will be given now of the subroutine SPEND which comprises the subroutine that is entered into when the end of a specification is sensed. Referring to FIG. 10A, when the system encounters an end-of-spec card, it proceeds via the connector J to the SPEND subroutine 201.

The subroutine begins by the terminal block 240 of FIG. 14, and proceeds to the first decision block 241. SPEND has two principal functions, the first is to finish off a preceding SPEC if there was one, and the second is to begin a subsequent SPEC if there is one. The first block 241 entered determines whether or not this is the first entrance to the SPEND subroutine. If it is the first time the program has entered the subroutine, there cannot have been a previous specification processed so the program proceeds along the line 242 to start through the processing block 243 where the program begins processing subsequent specifications. As can be seen from FIG. 10, the program automatically goes to SPEND in order to perform the preliminary functions for starting up or "initializing" a specification. Returning to the block 241, if it is not the first time the program has entered the subroutine SPEND, it indicates that it has in fact encountered an end-of-specification card, so that in the subroutine block 244, it prints trailer line or lines on the last page of the specification that it is finishing off, and proceeds to subroutine 245 which prints the Table of Contents from the Table of Contents file 33. The program then proceeds to the decision block 246. In the decision block 246, the program determines whether there are any specification errors stored on the disk file 34, and if there are none, it proceeds along the line 247 to the decision block 248. If there are such errors, the program retrieves those errors from the Specification Error File 34 in the I/O block 249 and, after printing those errors for the specification, it proceeds to the decision block 248. In the decision block 248, the program determines whether there are any instructions requested for this specification. If there are, it proceeds to SPEC 3 along the line 249, and if there are not, it begins the second principal function of the SPEND subroutine which is to prepare the computer for preparing a subsequent specification.

SPEC 3 will be discussed below. Continuing with the block 243, the program performs the housekeeping functions which include setting counters to zero, clearing storage arrays for subsequent usage, etc. After these housekeeping functions are performed, it proceeds to the I/O block 250 which determines the user's identification card from the disk.

As mentioned, each specification prepared begins with an identification card and ends with an end-of-specification record, including the last specification which, in addition to an end-of-specification record, includes an end-of-job record. Thus, in the block 250, the program reads the next record, determines in block 251 whether this is the beginning of a subsequent specification or the end of a job; if it is the end of a job, it exits via terminal block 252. If it is not an end-of-job, the program proceeds to the decision block 251A which tests to determine whether or not the user has requested instructions to be prepared—that is, whether he wants a prepared list of printed instructions after his specification data has been prepared. If not, the program proceeds on to block 253. If he does, however, it proceeds to block 251B which is a switch block for generating a signal which indicates that it is desired to prepare a set of instructions. At this point in the program, it has determined the identification of the user, and, referring to a specification order form of FIG. 3, the next card may be any of four things: (1) a request for selecting instructions to any of the persons indicated, (2) a TOP or BOT card, (3) a DIV card or (4) a SEC card.

After the next record is read via block 253 if the program detects the presence of a BOT card in block 254, it sets a switch in block 255 to BOT. This switch has three separate output states. Either it is off or it is set to BOT or it is set to TOP. Proceeding from the block 254 downward, it tests for TOP in block 256, and if the answer is yes, it proceeds through the switch block 257 to set the switch to TOP. If the card is neither a TOP or a BOT card, the program sets the header switch in block 258 to "off". The header switch is the switch the program sets via blocks 255, 257 or 258. If it has set the header switch either to TOP or BOT it proceeds to save the contents of the card in block 260 and to retrieve the next card from the disk in block 259. If it is set to off, the program proceeds directly to return via terminal block 260A without retrieving the next card because the card that has been read must be processed.

A TOP or a BOT card is used as an identifier for each page and gives the specifier the choice of putting his identification indicia at the top or the bottom of the final printed specification. If he uses a BOT card, the Division titles and page number appear on one line and the Section titles—that is, the title from a SEC card, appears on the next line. If a TOP card is used, then the identifying indicia is placed on the top two lines of a page of printed specification and the Division Title and page number and title on a SEC card appear as two lines at the bottom of a printed page.

SPEC 3

SPEC 3 is entered into as described in connection with FIG. 14 and as represented by the terminal block 300 in FIG. 15. Routine housekeeping functions are performed as schematically designated by the block 301, such as clearing the arrays, setting counters to zero, etc. The so-called housekeeping functions vary from machine to machine and persons skilled in the art will know what is referred to.

In general, SPEC 3 is used whenever a particular user wants to generate with some instructions for a particular job. There may be one or more sets of instructions, as already noted, such as instructions to the draftsman, instructions to the color coordinator, etc. all such instructions are stored in the file 39 and correlated to the phrase numbers entered by the specifier.

The organization of the instruction files are very similar to the organization of the Specification Index File 27 and Specification Data File 28, as discussed in detail above. That is, it includes an Instruction Index File 37 and an Instruction Data File 39 (FIG. 1). In the Instruction Index File 37, which identifies a particular instruction, the storage location is found in the same way that a record is found in the Specification Index File—namely, by dividing the Section Group Number by five. This then gives the location in the Instruction Index File for the information required to locate an instruction in the Instruction Data File. In the Instruction Index File, each record contains ten words, rather than four as in the case of the Specification Index File.

The SPEC 3 portion of the program processes all the instructions of the draftsmen together, all the instructions of the engineers, etc. as a unit. Therefore, the program knows which particular type of instruction it is looking for so it knows where, within a word in the instruction index file to look for the information desired. For example, if it is processing an instruction to engineers, it looks in words 5 and 6 of the 10-word record located in the Instruction Index File associated with that Section Group Number. For the instructions to the engineers, color coordinators and contract administrators, the user need not specify a file number because these files are much smaller than the Specification Data File.

As before, the program looks in the Instruction Index File 37 to locate a particular group of words that will lead it to the desired phrase in the Instruction Data File 39. Whereas before, in the case of the Specification Index File, the first seven records were known; in the case of the Instruction Index File, the first six records are known. It is smaller in the latter case because we no longer have a title or Section Group name, as in the case of the Specification Index File. As before, there is a table of displacements in the records associated with a given Section Group Number in the Instruction File 39. There is one slight difference between the Instruction Data File 39 and the Specification Data File 28, and it is that whereas there was always a phrase No. 8 in each Section Group in the Specification Data File, and the specifier knew where it was (word zero of record eight), this is not the case in the Instruction Data File.

Recalling back, as the program begins, the specifier decides whether or not there is to be prepared a list of instructions by checking a box on line L-2 of the original order form. The instructions have already been prepared and are stored on the Instruction Data File 39. For some of the phrase numbers in the Master Phrase Catalog, there will be no associated instructions to draftsmen, etc., so that there is a place in the Instruction Data File 39 to indicate that there is no associated instruction. This is indicated by placing a −1 in the appropriate entry of the displacement table.

A distinction is made between a phrase in the Specification Data File which corresponds to a "phrase" in the Master Phrase Catalog, and, in the case of the Instruction Data File, an "instruction phrase" where "phrase" here refers to an arbitrary grouping of words comprising an instruction. That is, the latter may be a sentence or even a whole paragraph; and identation for outlining is not as important. The important thing is the prepared instructions are printed automatically if the specifier wants a set of instructions.

The first subroutine encountered in SPEC 3 is S3END, designated by the block 302 in FIG. 13. As will be described, it is a subroutine which finishes off one of the instructions within a given specification. It will be called into use for each different set of instructions required in that particular user's specification. It determines which set of instructions will be produced and that they will be prepared in the required order.

The program next proceeds into a subroutine 303 which gets the next word from the Instruction Input File 35 which serves as the input to SPEC 3. The program is not reading cards here, it is reading from an actual disc file produced by SPEC 2.

In general, the organization of the data on the Instruction Input File 35 is simply streams of data, not organized in records, as was the Edited Input File 36 serving as the input to SPEC 2.

The first decision block encountered, designated 304, determines whether the first word is a phrase number. If it is, the program enters into the subroutine S3PHR designated 305. The subroutine S3PHR has to look at the next word to see whether it contains any subject matter which has to be inserted, so in re-entering the loop, the program retrieves the next word from the Instruction Input File. Proceeding on, then, a decision block 306 determines the particular type of input. These inputs are determined by the particular coding of the word. This is also true of the manner in which a phrase number is identified in block 304. Thus, depending upon the particular coding, the program is able to determine what the information is that follows that first retrieved word.

Once the program determines what the information is in the decision block 306, the SPEC 3 program enters into one of the subroutines identified by the blocks 307, 308, 309, 310, or, alternatively, determines that it is an end-of-spec in which the program is looped back to the subroutine S3END. If it is one of the following: Section Group Number, ADD command, Division Title or Section Title, the appropriate subroutine is entered into, as illustrated. After the subroutine is finished, the program loops back to the subroutine 303 to obtain the next word from the Instruction Input File.

We will now discuss each of the subroutines disclosed above.

S3END

Figure 16:
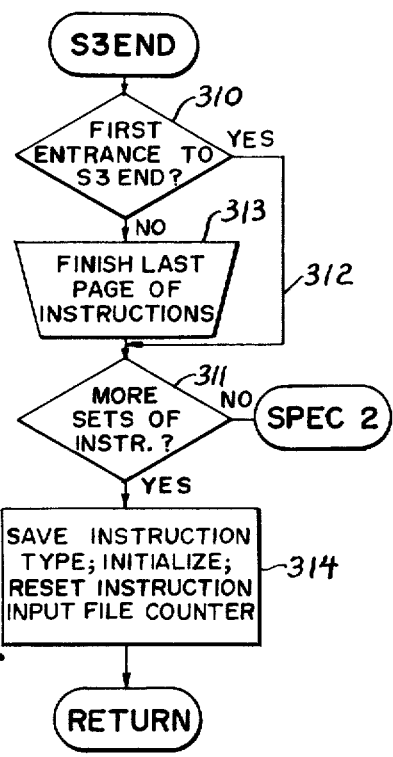

Referring to FIG. 16, at the beginning of S3END, the program determines whether or not it is finishing off a previous set of instructions (within a given architectural specification). Thus, it determines in decision block 310 whether it is entering S3END for the first time. If the answer is yes, it proceeds down to the decision block 311 via the flow line 312; if the answer is no, it finishes the last page of preceding instructions, as indicated by the I/O block 313. By finishing the last page of the preceding set of instructions, the printer first skips to the bottom of the page, prints any required lines, and then moves on to the next page. Next, in decision block 311, it determines whether there are any more sets of instructions to produce. The reason for this is that the user may require only one set of instructions and not any others. If there are no more, the program proceeds back to SPEC 2 (see FIG. 14 and block 243) where SPEC 2 will then determine whether there are any more sets of specifications to be produced.

If in block 311 the program determines that there are more sets of instructions required, it proceeds to the processing block 314 wherein it stores the instruction type, initializes for housekeeping instructions, resets the instruction input file counter to zero, and returns back to the main line in FIG. 15. This exits the subroutine S3END. The reason for setting the input file counter to zero is that the program goes to step through the Input Instruction File to SPEC 3 for each set of instructions.

That is to say, each specification may have one or more sets of instructions to be prepared. SPEC 2 prepares a file for each specification in the Instruction Input File 35. SPEC 3, then, proceeds through the Instruction Input File 35 for each set of instructions that it will prepare for a given final specification. For example, if there are required to be produced a set of instructions for the draftsman and a set of instructions for a color coordinator only, SPEC 3 will step through the Instruction Input File 35 twice to produce the two different sets of instructions.

After exiting S3SEC, the program goes back in the main line of SPEC 3 to block 303 and determines what type of card the next card is. In the case of material from the ADD commands (block 308 in FIG. 15), the program does not print this material in the instruction lists. Rather, whenever this is encountered in the Instruction Input File, it is skipped over and an automatic message is inserted to indicate that the material had been added to the user's specification being prepared by SPEC 2. The point is that the program cannot tell whether the added material is relevant to this set of instructions, so it merely prints out information in this particular set of instructions that an insert has been added to the specification, referring to the specification page number at which the added material may be found, to enable the user to read the added material.

S3SEC

Figure 18:
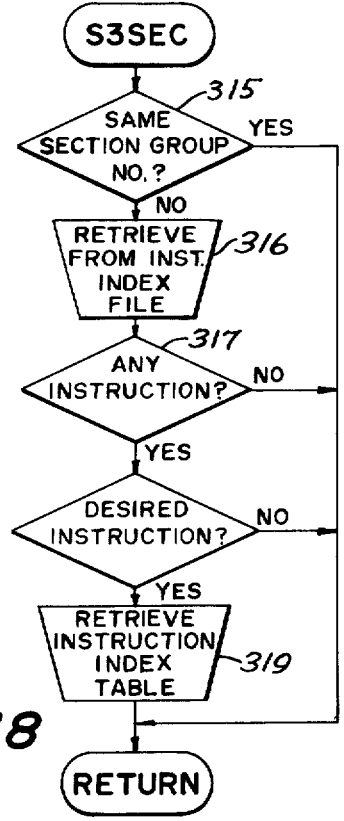

Referring to FIG. 18, first decision of this subroutine is made in block 315 wherein it determines whether or not this Section Group Number is the same as the last Section Group Number. The program gets an instruction index table for each Section Group Number; and if it already has that information, there is no point in retrieving it again. Thus, if it does not have the information, it proceeds to the I/O block 316 to get the location of the Section Group Number on the Instruction Index File from the Instruction Index File. In order to find out where the instruction is located in the Instruction Data File, the program goes to the Instruction Index File, and asks two questions: (1) are there any instructions of any type for this particular Section Group Number (block 317), and (2), are there any instructions of the desired or requested type (block 318). If the answer to either of these questions is no, in the order asked, the program proceeds to exit from this subroutine. If and only if the answer to both questions is yes, then the program gets the instruction index table (block 319) from the Instruction Index File and this indicates the location of the instruction in the Instruction Data File.

S3TTL

Figure 17:
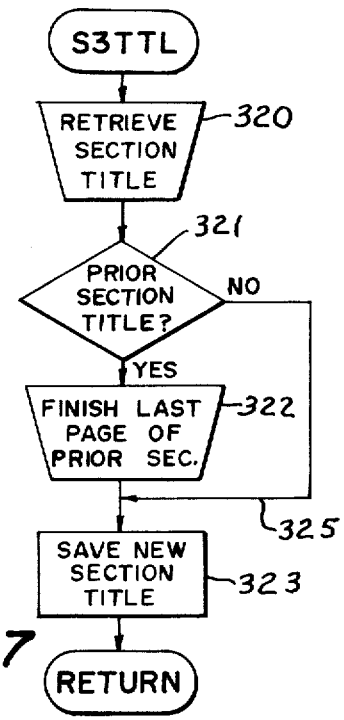

The program enters this subroutine when it has determined from the code word that it has a Section Title to process. The subroutine is illustrated in FIG. 17. In the first I/O block 320, the program reads the Section Title from the Instruction Input File 35. Next, it proceeds to the decision block 321 wherein it determines whether there is a previous Section to finish. If there is, it finishes the last section in the I/O block 322 and proceeds to the processing block 323. If there is no previous section to finish, it proceeds directly via flow line 325 to the processing block 323 wherein it stores or saves the new Section Title. It then exits this subroutine.

S3DIV

Figure 19:
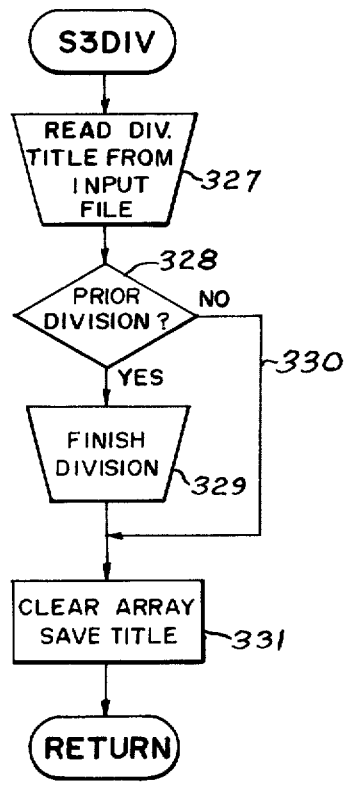

Referring now to FIG. 19, the program enters the subroutine S3DIV at the terminal block 326, and in the first I/O block 327, it reads the Division Title from the Instruction Input File 35 of FIG. 1. Next, in the decision block 328, it determines whether there is a preceding Division to finish. If so, it finishes the last page of the preceding Division in the I/O block 329, and if not, it proceeds via the flow line 330 to the processing block 331. After finishing the last page of the preceding Division in the I/O block 329, the program also proceeds to the processing block 331 wherein it clears the Section Title array and stores the new Division Title. The reason for this is that whenever it encounters a Division, it clears the Section Title if there was one and starts a new Division. That is, any subheading from the last Division has no further use.

S3PHR

Figure 20:
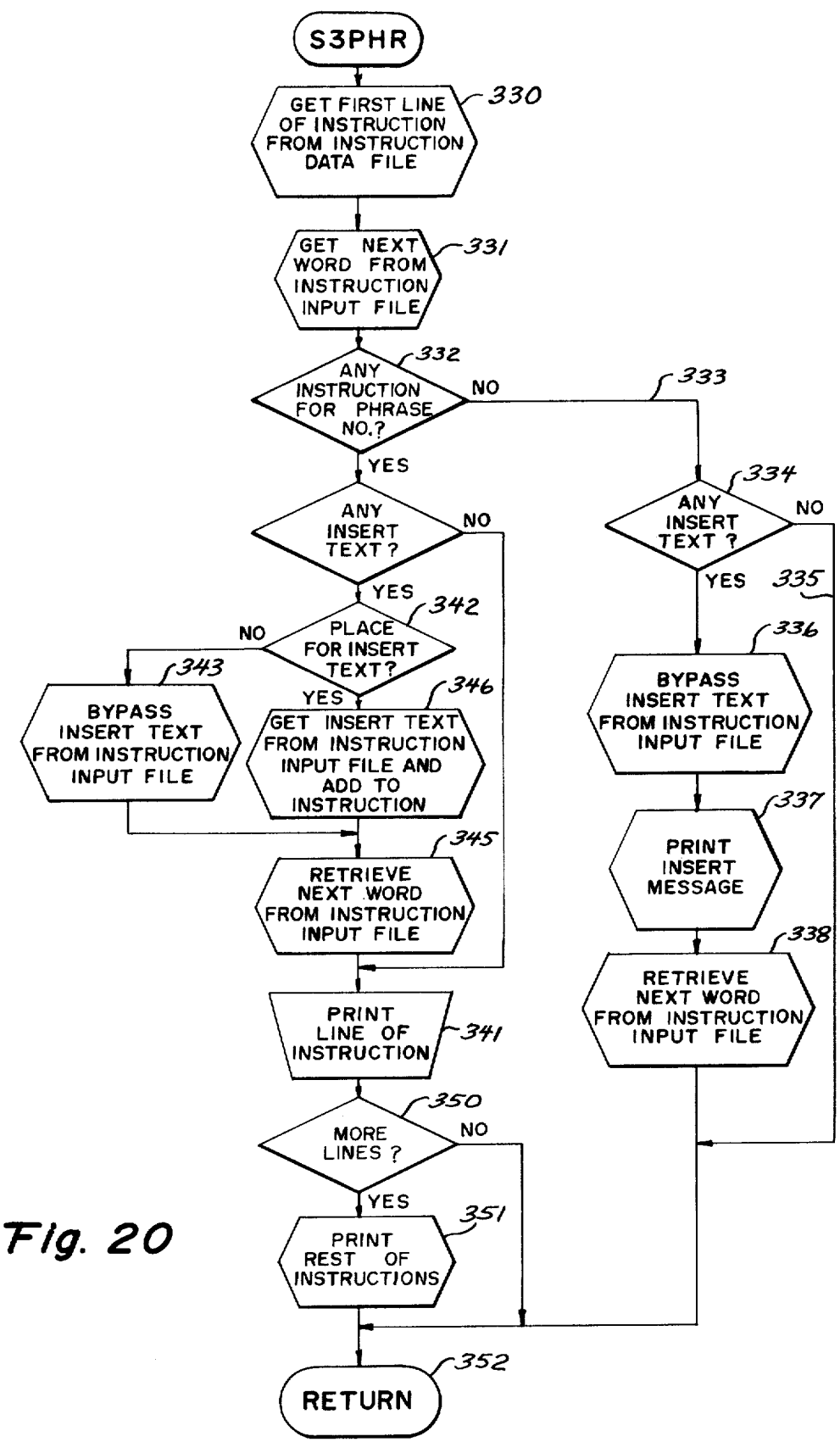

Referring to FIG. 20, the subroutine S3PHR is entered when SPEC 3 detects a phrase word, so in the first subroutine block labeled 330, it attempts to get the first line of instruction from the Instruction Data File. There may not be any instructions for that phrase number. In block 331, it gets the next word from the Instruction Input File—that is, the word following the word it is processing; and this is done in preparation for the insertion of material, if required.

After this, it proceeds to the decision block 332, wherein it is determined whether there is an instruction for this phrase number. If there is no instruction for this particular phrase number, it proceeds via the flow line 333 to the decision block 334 wherein it is determined whether this phrase number is followed by insert text; if the answer here is no, it proceeds via line 335 to exit the subroutine. If this phrase number is followed by insert text, the program gets the insert text from the Instruction Input File 135A, but does not use it immediately because the program cannot assign a meaning to it and does not know how to handle it. This is designated by the subroutine 336, from which it proceeds to subroutine 337 wherein the insert message, if any, is printed on the instructions. Next, in block 338, the program gets the next word from the Instruction Input File and exits the subroutine.

Returning now to the decision block 332 wherein it is determined that there is an instruction for this phrase number, the program first asks in block 339 whether there is a phrase number followed by insert text. If not, it proceeds via flow line 340 to print this line of instructions in the I/O block 341. If there is insert text following the Phrase Number, the program proceeds to the I/O block 342 to determine whether there is a place in the instruction for the insert text (i.e., a Stop Code). If there is none, it proceeds to the block 343 where it gets the holds the insert text for the same reason as mentioned above in connection with the block 336. Then, it proceeds via flow line 344 to the subroutine 345 where it retrieves the next word from the Instruction Input File. If there had been a place in the instruction for insert text, it gets the insert text from the Instruction Input File and adds it to the instruction in block 346.

The program then proceeds to block 345, already described. After exiting block 345, the program proceeds to print this line of instructions in the I/O block 341, and then moves to the decision block 350 which determines whether there are any more lines to this particular instruction. If there are none, it exits the subroutine, and if there are, it retrieves and prints the rest of the instruction in the subroutine 351, and exits the subroutine via terminal block 352.

We claim:

1. An automated system for preparing a printed architectural specification and related instructions comprising: a master catalog including a large number of printed phrases indicating materials and construction techniques from which a specifier may choose, each phrase having associated with it a short code; order form means on which a specifier may record code selected from said catalog and representative of a desired sequence of said phrases; data processing means adapted to receive input signals representative of the code prepared by the specifier and including a Specification Data File storing signals representative of said phrases; Specification Index File means addressable by said data processing means and storing signals representative of the locations of said phrases in said Specification Data File; instruction file means storing signals representative of prepared instructions for predetermined ones of said phrases and correlated with said phrases by code; and program means for operating said data processing means for receiving said input signals representative of said code, for referencing said Specification Index File to obtain the location of phrases called for by said input code in said Specification Data File, for printing an output specification incorporating said phrases from said Specification Data File as determined by the input code, and for printing out instructions from said instruction file means corresponding to said printed specification as determined by said input code.

2. The system of claim 1 further comprising second program means for operating said data processing means to check said input code and prepare an edited input file for operation by said first-named program means, said second program means checking said input code for fatal errors prior to preparing said edited input file.

3. The system of claim 1 characterized in that said instruction file means includes an Instruction Data File storing signals representative of instructions correlated through said input code with phrase signals on said Specification Data File and an Instruction Index File storing signals representative of the location of instruction text signals on said Instruction Data File and relating said locations with the input code entered by a specifier.

4. The system of claim 1 wherein said catalog is subdivided into a plurality of section groups, each section group containing a plurality of phrases logically associated therewith, each section group further being associated with a section group code, and each phrase in each section group being associated with a phrase number code, said system being adapted to accept a limited number of commands by said specifier including a SEC command, and an ADD command, said data processing means further being programmed to process a SEC command by locating a Section Group Code on said Specification Data File, the phrase number code entered on said order form means associated with each SEC command being found within the memory allocation on the Specification Data File associated with that SEC command; said computer being further programmed to process an ADD command to add to the printed specification any material inserted by the specifier related to said ADD command.

5. The system of claim 4 wherein said system further comprises a DIV command and said data processing means is programmed to divide the printed specification into major divisions associated with a DIV command, said DIV command being adaptable to insert a division title in the printed specification in accordance with a phrase number code of a desired section group.

6. The system of claim 3 wherein said order form means includes indicia for indicating which of a predetermined number of instruction types is to be included into the printed specification, and a plurality of columns for recording said code, at least one of said columns being reserved for entering the code for said commands.

7. A system for preparing a printed architectural specification comprising: Specification Data File means including a quantity of predetermined information stored in a data processor memory and divided into individual phrases with predetermined indentation for print-out, said phrases being recallable by means of a Specification Index File means; and a programmed data processor adapted to receive input coded characters representative of a predetermined sequence and outlining of said phrases in said Specification Data File means for preparing an edited input data file free of fatal errors; said data processor being further programmed to print out a set of specifications according to the input code of the specifier from the Specification Data File and said edited input file.

8. A system for preparing a computerized architectural specification comprising: a master catalog including a large number of phrases with predetermined indentations in outline form, said phrases being separated according to section groups, each section group being identifiable by a section group code and each phrase within a section group being identifiable by a phrase code, whereby a specifier may prepare a complete phrase specification by selecting said codes in proper sequence; and a programmed data processor including a specification data file storing all of the phrases in said catalog in signals retrievable by said processor and indexed according to the section group code and phrase code; said data processor further including specification index file means correlating the section group code and phrase code with the associated phrases in the specification data file, said data processor being programmed to receive the input code and classify it according to whether it is a section command, a division command, an ADD command, a phrase code command, or an END command, said END command terminating a specification, said SEC command establishing that a section group number exists on the specification index file and is valid, said data processor storing the contents of said SEC card on an edited input file if no errors exist, said program further including a division command subroutine for identifying a division command to determine if the specifier added a title, and if so, to store the contents of a card on the edited input file, said division command subroutine further determining that if a user did not specify a title, whether he indicated a title by a valid phrase code, and if so, to retrieve that phrase code from the specification index file and thence to store the record on the edited input file for further operation by said data processor, said program being further adapted to process an ADD command to transfer all information relating to said ADD command to the edited input file, and being further adapted to process a phrase number card to determine whether such phrases exist in the specification data file and, if so, to transfer said phrases to the edited input file.

9. A system for preparing an architectural specification comprising: a specification index file storing recorded signals representative of a plurality of phrases with associated code, whereby a specifier by writing code may determine the sequence and relation of said phrases; data processing means adapted to receive input code representative of a predetermined sequence of said phrases; first program means in said data processing means for receiving input code for checking said input code to determine whether it contains any errors which would prevent further processing of said input code and, if not, for preparing an edited input file of said code; second program means for processing the code on said edited input file to prepare a printed specification according to the code sequenced by a specifier and contained in said specification data file and for preparing a set of signals on an instruction input file, said last-named signals being correlated with said phrases through said input code; and third program means for operating on said instruction input file to prepare a set of instructions from an instruction data file.

10. The system of claim 9 wherein said second program means is further adapted to prepare a table of contents including major subheadings of said printed specification and a table of non-fatal errors contained in said input code.

11. The system of claim 9 wherein said first program means is further adapted to print out a listing of the input code to facilitate checking thereof.

12. The system of claim 11 wherein said print-out of the input code listing contains marginal information to facilitate correlating of the input listing print-out with the input code format.

13. The system of claim 9 characterized in that said first program means is adapted to process a plurality of separate input specifications and to store only those which are capable of being processed by said second program means on said edited input file, whereby a plurality of input specifications may be stored on said edited input file prior to processing by said second program means.

14. A process for preparing a computerized architectural specification from a master catalog including a large number of phrases with predetermined indentations in outline form, said phrases being separated according to section groups, each section group being identifiable by a section group code and each phrase within a section group being identifiable by a phrase code, whereby a specifier may prepare a complete phrase specification by selecting said codes in proper sequence, said process comprising storing all of the phrases in said catalog in data signals on a specification data file of a data processor, said signals being retrievable by said processor and indexed according to the section group code and phrase code; storing index data signals in said data processor representative of a specification index file, said index data signals correlating the section group code and phrase code with the associated phrases in the specification data file; programming said data processor to receive input code prepared by a specifier and classify it according to whether it is a section command, a division command, an ADD command, a phrase code command, or an END command, said END command terminating a specification, said SEC command establishing that a section group number exists on the specification index file and is valid; programming said data processor to store contents of said SEC card on an edited input file is no errors exist, programming said data processor by means of a division command subroutine to identify a division command and determine if the specifier added a title, and if so, to store the contents of a card on the edited input file, said division command subroutine further determining that if a user did not specify a title, whether he indicated a title by a valid phrase code, and if so, retrieving that phrase code from the specification index file and thence storing the record on the edited input file for further operation by said data processor; programming said data processor further to process an ADD command to transfer all information relating to said ADD command to the edited input file; and programming said data processor further to process a phrase number card to determine whether such phrases exist in the specification data file and, if so, to transfer said phrases to the edited input file.

15. A process for preparing an architectural specification comprising: storing recorded signals representative of instruction data on an instruction data file; storing recorded signals representative of a plurality of phrases with associated code on a specification data file; whereby a specifier by writing code may determine the sequence and relation of said phrases; programming a data processor to receive input code representative of a predetermined sequence of said phrases and to check said input code to determine whether it contains any errors which would prevent further processing of said input code and, if not, to prepare an edited input file of said code; programming said processor to process the code on said edited input file and to prepare a printed specification from said specification data file according to the code sequenced by a specifier and to prepare a set of signals on an instruction input file, said last-named signals being correlated with said phrases through said input code; and programming said data processor to operate on said instruction input file to prepare a set of instructions from said instruction data file; said instructions being associated with corresponding data on said printed specification.

16. The process of claim 15 further comprising the step of programming said data processor to prepare a table of contents including major subheadings of said printed specification and a table of non-fatal errors contained in said input code.

17. The system of claim 16 further comprising the step of programming said data processor to process a plurality of separate input specifications and to store only those which are capable of being processed by said second program means on said edited input file, whereby a plurality of input specifications may be stored on said edited input file prior to processing by said second program means.

* * * * *